(12) United States Patent
Suenaga

(10) Patent No.: US 6,313,669 B1
(45) Date of Patent: Nov. 6, 2001

(54) BUFFER CIRCUITRY

(75) Inventor: Koichi Suenaga, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/285,683

(22) Filed: Apr. 5, 1999

(30) Foreign Application Priority Data

Oct. 19, 1998 (JP) .................................................. 10-297080

(51) Int. Cl.$^7$ ............................... H03B 1/00; H03K 3/00
(52) U.S. Cl. ....................... 327/108; 327/112; 327/39; 327/42; 226/16; 226/87
(58) Field of Search ............................... 327/39–45, 108, 327/112, 170, 374, 376, 377; 326/83, 86, 87, 16

(56) References Cited

U.S. PATENT DOCUMENTS

| | | | |
|---|---|---|---|
| 5,319,258 | * 6/1994 | Ruetz | 327/108 |
| 5,512,854 | * 4/1996 | Park | 327/374 |
| 5,610,548 | * 3/1997 | Masleid | 327/112 |
| 5,773,999 | * 6/1998 | Park et al. | 327/108 |
| 6,150,853 | * 11/2000 | Chrappan et al | 327/108 |

* cited by examiner

*Primary Examiner*—Terry D. Cunningham
*Assistant Examiner*—Long Nguyen
(74) *Attorney, Agent, or Firm*—Burns, Doane, Swecker & Mathis, LLP

(57) ABSTRACT

There is provided buffer circuitry that can include a data output circuit for connecting a first power supply to its output terminal when a data applied thereto is at a HIGH level, or connecting a ground to the output terminal when the data is at a LOW level, a comparator for comparing the frequency of a clock signal applied thereto with a reference frequency, and a driving capability changing circuit for, only if the comparator outputs a comparison result indicating that the frequency of the clock signal is greater than the reference frequency, connecting a second power supply to the output terminal when the data is at a HIGH level, or connecting a ground to the output terminal when the data is at a LOW level.

5 Claims, 32 Drawing Sheets

TEST CARRIED OUT ON A FALLING EDGE OF AN INCOMING DATA

STROBE POINT

TEST CARRIED OUT ON A RISING EDGE OF AN INCOMING DATA

STROBE POINT

TEST CARRIED OUT ON A FALLING EDGE OF AN INCOMING DATA

TEST CARRIED OUT ON A RISING EDGE OF AN INCOMING DATA

BUFFER CIRCUITRY

BACKGROUND OF THE INVENTION

1. Field of the Invention

The present invention relates to buffer circuitry for temporarily storing a data and for furnishing the data to its output terminal.

2. Description of the Prior Art

Referring now to FIGS. 34(a) and 34(b), there are respectively illustrated diagrams showing a method of testing prior art buffer circuitry when a data applied to the buffer circuitry makes a HIGH to LOW transition and when the data makes a LOW to HIGH transition. In the figures, reference numeral 1 denotes the waveform of a data furnished by way of an output terminal of prior art buffer circuitry, which makes a HIGH to LOW transition, 2 denotes the waveform of the clock signal (CLK), VOL denotes a first threshold voltage that is used when a data furnished via the output terminal makes a HIGH to LOW transition, 4 denotes the waveform of a data furnished by way of the output terminal of the buffer circuitry, which makes a LOW to HIGH transition, and VOH denotes a second threshold voltage that is used when a data furnished via the output terminal makes a LOW to HIGH transition.

When the buffer circuitry receives an incoming signal at a HIGH level, it can furnish an output signal at a HIGH level by way of its output terminal. In contrast, when the buffer circuitry receives an incoming signal at a LOW level, it can furnish an output signal at a LOW level by way of its output terminal. The buffer circuitry can be tested to check the operation of the buffer circuitry in the following manner.

First, a test to check the operation of the buffer circuitry on falling edges of incoming data is carried out by applying a data at a LOW level to the buffer circuitry in synchronization with a rising edge of CLK (in the example of FIG. 34(a), the data is input to the buffer circuitry at point a). The potential of the data furnished by way of the output terminal of the buffer circuitry start decreasing gradually since point a.

A volt-ohm-millimeter or the like connected to the output terminal of the buffer circuitry can measure the potential of the data furnished by way of the output terminal of the buffer circuitry at a strobe point b and then compare the potential of the data measured at the strobe point with the first threshold voltage VOL after the buffer circuitry has received the data at a LOW level.

Thus it can be determined that the buffer circuitry operates well when the test instrument indicates that the measured potential of the output data is lower than or equal to the first threshold voltage VOL; otherwise, that is, when the test instrument indicates that the measured potential of the output data is higher than the first threshold voltage VOL, the buffer circuitry is at fault.

Further, a test to check the operation of the buffer circuitry on rising edges of incoming data is carried out by applying a data at a HIGH level to the buffer circuitry in synchronization with a rising edge of CLK (in the example of FIG. 34(b), the data is input to the buffer circuitry at point c). The potential of the data furnished by way of the output terminal of the buffer circuitry start increasing gradually since point c.

The test instrument connected to the output terminal of the buffer circuitry can measure the potential of the data furnished by way of the output terminal of the buffer circuitry at a strobe point d, and then compare the potential of the data measured at the strobe point with the second threshold voltage VOH after the buffer circuitry has received the data at a HIGH level.

Thus it can be determined that the buffer circuitry operates well when the test instrument indicates that the measured potential of the output data is higher than or equal to the second threshold voltage VOH; otherwise, that is, when the test instrument indicates that the potential of the output data is lower than the second threshold voltage VOH, the buffer circuitry is at fault.

Although a prior art technique for improving the driving capability of buffer circuitry when testing the buffer circuitry is disclosed in Japanese Patent Application Publication (KOKAI) No. 2-26412, it is not adapted to improve the driving capability of the buffer circuitry according to a change in the frequency of the clock signal CLK.

A problem with prior art buffer circuitry, which is so constructed as mentioned above, is that although the settings of the strobe point and the first and second threshold voltages according to the frequency of CLK make it possible to properly check the operation of the buffer circuitry, a test program to set the strobe point and the first and second threshold voltages has to be changed every time the frequency of CLK is varied, thereby preventing a speedup in the checking of the operation of the buffer circuitry.

SUMMARY OF THE INVENTION

The present invention is made to overcome the above problem. It is therefore an object of the present invention to provide buffer circuitry for making it possible to check the operation of the buffer circuitry speedily even if the frequency of a clock signal CLK is varied.

In accordance with one aspect of the present invention, there is provided buffer circuitry for receiving a data applied thereto and furnishing a signal corresponding to the received data by way of an output terminal, the buffer circuitry comprising: a data output circuit for connecting a first power supply to the output terminal when the data is at a HIGH level, or connecting a ground to the output terminal when the data is at a LOW level; a comparator for comparing the frequency of a clock signal applied thereto with a reference frequency; and a driving capability changing circuit for, only if the comparator outputs a comparison result indicating that the frequency of the clock signal is greater than the reference frequency, connecting a second power supply to the output terminal when the data is at a HIGH level, or connecting a ground to the output terminal when the data is at a LOW level. The buffer circuitry can have a mechanism for activating the driving capability changing circuit only if the buffer circuitry is placed in test mode to check for operation of the buffer circuitry.

In accordance with another aspect of the present invention, there is provided buffer circuitry comprising: a data output circuit for receiving a data applied thereto and for furnishing the data received to an output terminal; a comparator for comparing the frequency of a clock signal applied thereto with a reference frequency; and a driving capability changing circuit for connecting a power supply to the output terminal when the data is at a HIGH level, and for connecting a ground to the output terminal when the data is at a LOW level, only if the comparator outputs a comparison result indicating that the frequency of the clock signal is greater than the reference frequency. The buffer circuitry can have a mechanism for activating the driving capability changing circuit only if the buffer circuitry is placed in test mode to check for operation of the buffer circuitry.

In accordance with another aspect of the present invention, there is provided buffer circuitry for receiving a data applied thereto and furnishing a signal corresponding to the received data by way of an output terminal, the buffer circuitry comprising: a data output circuit for connecting a power supply line to the output terminal when the data is at a HIGH level, or connecting a ground to the output terminal when the data is at a LOW level; a comparator for comparing the frequency of a clock signal applied thereto with a reference frequency; and a driving capability changing circuit for connecting a first power supply to the power supply line when the comparator outputs a comparison result indicating that the frequency of the clock signal is less than or equal to the reference frequency, or connecting a second power supply having a higher potential than the first power supply to the power supply line when the comparator outputs a comparison result indicating that the frequency of the clock signal is greater than the reference frequency. The buffer circuitry can have a mechanism for connecting the first power supply to the power supply line without connecting the second power supply to the power supply line if the buffer circuitry is not placed in test mode to check for operation of the buffer circuitry.

In accordance with another aspect of the present invention, there is provided buffer circuitry for receiving a data applied thereto and furnishing a signal corresponding to the data by way of an output terminal, the buffer circuitry comprising: a first data output circuit for connecting a ground to the output terminal when the data is at a LOW level; a comparator for comparing the frequency of a clock signal applied thereto with a reference frequency; a second data output circuit for connecting a first potential to the output terminal when the comparator outputs a comparison result indicating that the frequency of the clock signal is less than or equal to the reference frequency; and a third data output circuit for connecting a second potential that is higher than the first potential to the output terminal when the comparator outputs a comparison result indicating that the frequency of the clock signal is greater than the reference frequency and when the data is at a HIGH level.

Preferably, the second data output circuit includes a first power supply and connects the first power supply to the output terminal when connecting the first potential to the output terminal, and the third data output circuit includes a second power supply having a higher potential than the first power supply and connects the second power supply to the output terminal when connecting the second potential to the output terminal. As an alternative, the second data output circuit includes a first power supply and a pull-up resistor and connects the first power supply, by way of the pull-up resistor, to the output terminal when connecting the first potential to the output terminal, and the third data output circuit includes a second power supply having the same potential as the first power supply and connects the second power supply to the output terminal when connecting the second potential to the output terminal. The buffer circuitry can have a mechanism for causing the second data output circuit to connect the first power supply to the output terminal and for deactivating the third data output circuit, regardless of a comparison result from the comparator, if the buffer circuitry is not placed in test mode to check for operation of the buffer circuitry.

Further objects and advantages of the present invention will be apparent from the following description of the preferred embodiments of the invention as illustrated in the accompanying drawings.

BREIF DESCRIPTION OF THE DRAWINGS

FIG. 1 a schematic circuit diagram showing the structure of buffer circuitry according to a first embodiment of the present invention;

FIG. 8($b$) is a diagram showing a method of testing the buffer circuitry of the first embodiment when the data makes a LOW to HIGH transition;

Figure 32:
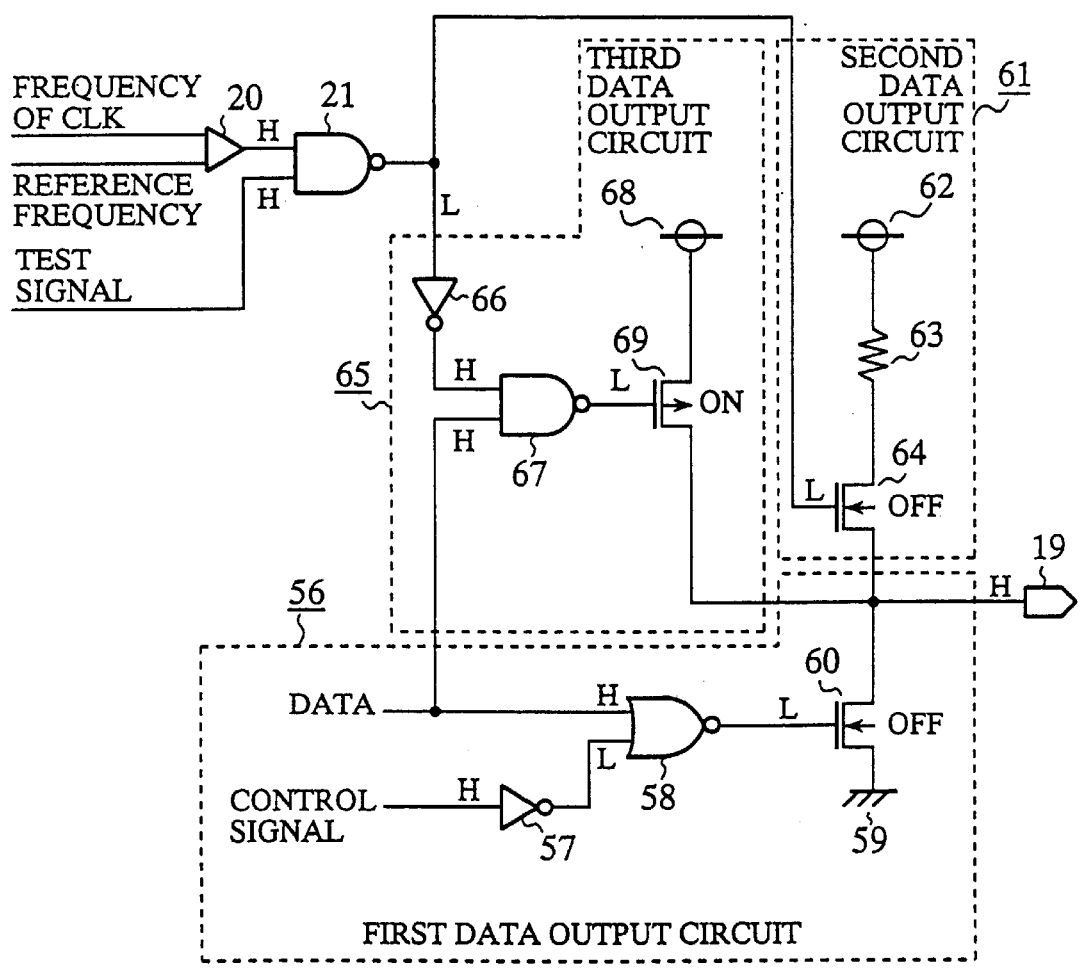
Figure 33:
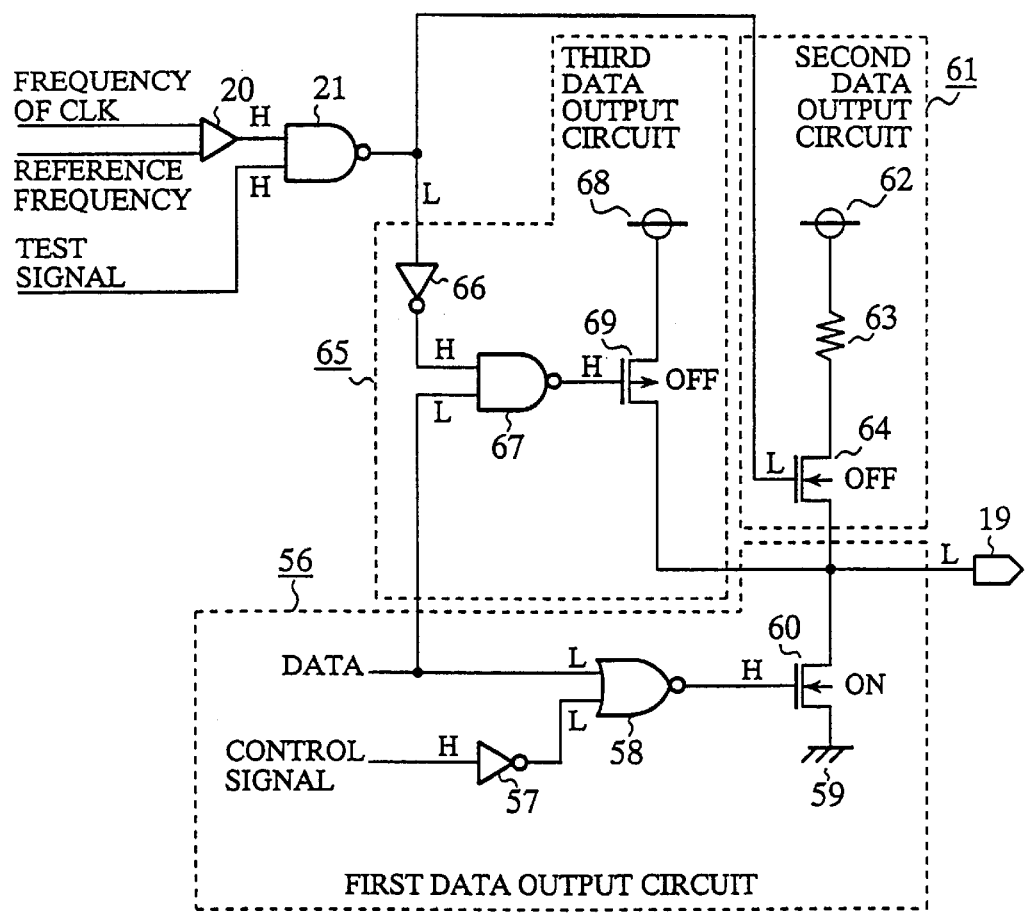
Figure 34A:
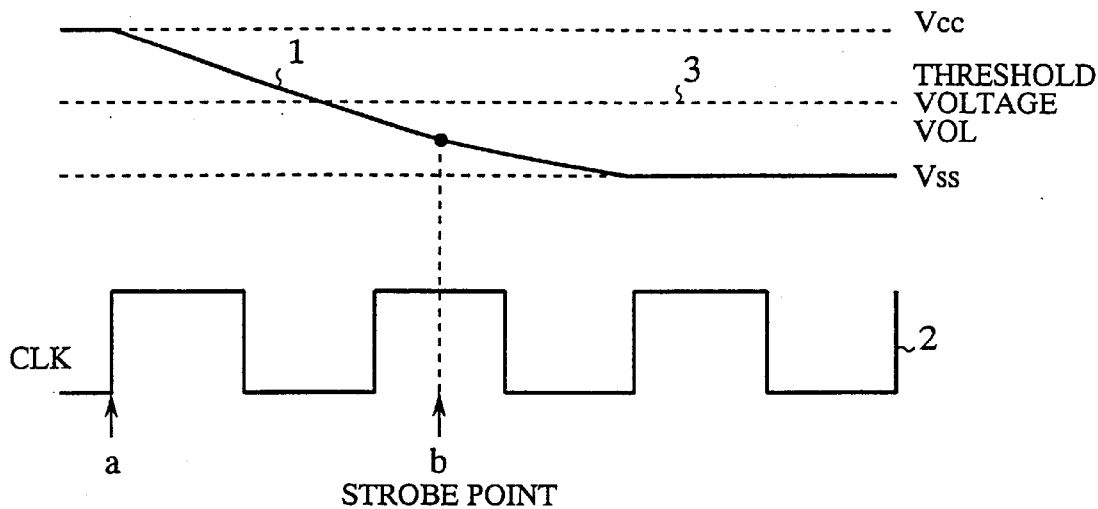
Figure 34B:
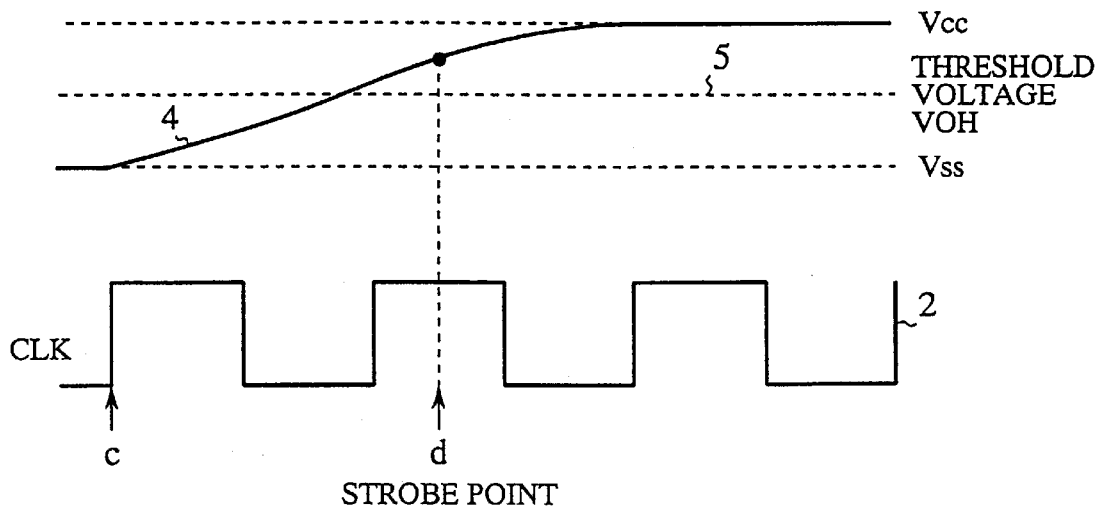

FIG. 32 a schematic circuit diagram showing an operation the buffer circuitry of the fourth embodiment that is placed in test mode when the buffer circuitry receives a data at a HIGH level and when the frequency of the clock signal is greater than the reference frequency;

FIG. 33 is a schematic circuit diagram showing an operation of the buffer circuitry of the fourth embodiment that is placed in test mode when the buffer circuitry receives a data at a HIGH level and when the frequency of the clock signal is greater than the reference frequency;

FIG. 34(*a*) is a diagram showing a method of testing prior art buffer circuitry when a data applied to the buffer circuitry makes a HIGH to LOW transition; and FIG. 34(*b*) is a diagram showing a method of testing the prior art buffer circuitry when the data makes a LOW to HIGH transition.

DETAILED DESCRIPTION OF THE PREFERRED EMBODIMENTS

First Embodiment

Figure 1:
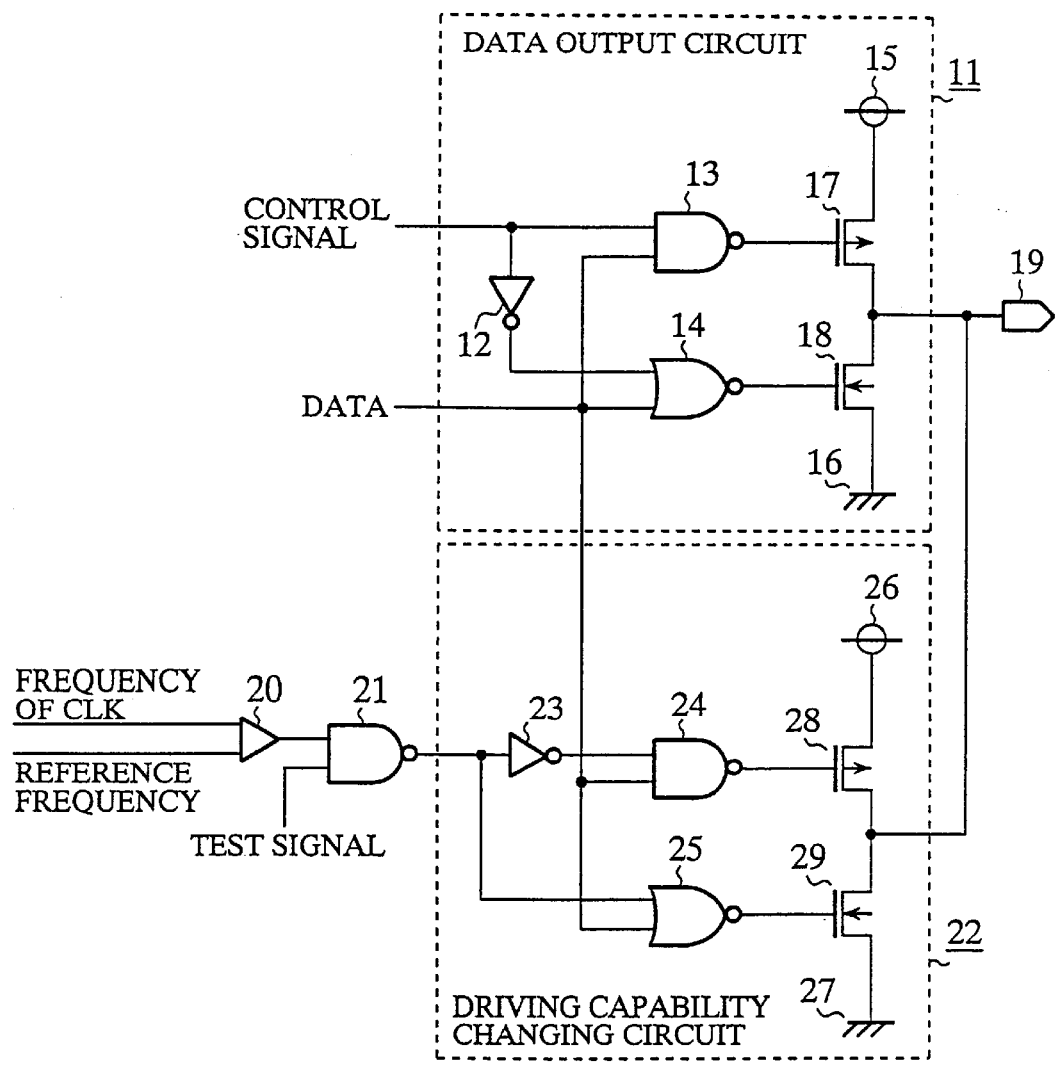

Referring next to FIG. 1, there is illustrated a schematic circuit diagram showing the structure of buffer circuitry according to a first embodiment of the present invention. In the figure, reference numeral 11 denotes a data output circuit for connecting a first power supply 15 to an output terminal 19 when the buffer circuitry receives a data at a HIGH level, or for connecting a ground 16 to the output terminal 19 when the buffer circuitry receives a data at a LOW level, 12 denotes an inverter for inverting a control signal applied thereto, 13 denotes a NAND gate for implementing the logical NAND operation on the control signal and the data applied thereto, 14 denotes a NOR gate for implementing the logical NOR operation on an output signal from the inverter 12 and the data applied thereto, 17 denotes a P-channel transistor that is turned on when its base terminal makes a HIGH to LOW transition, and that is turned off when the base terminal makes a LOW to HIGH transition, and 18 denotes an N-channel transistor that is turned on when its base terminal makes a LOW to HIGH transition, and that is turned off when the base terminal makes a HIGH to LOW transition.

In addition, reference numeral 20 denotes a comparator for comparing the frequency of a clock signal (CLK) with a reference frequency, and for furnishing a signal at a HIGH level when the frequency of CLK is greater than the reference frequency, or furnishing a signal at a LOW level when the frequency of CLK is less than or equal to the reference frequency, and 21 denotes a NAND gate for implementing the logical NAND operation on an output signal from the comparator 20 and a test signal applied thereto. Reference numeral 22 denotes driving capability changing circuit for, only if an output signal from the NAND gate 21 is at a LOW level, connecting a second power supply 26 to the output terminal 19 when the buffer circuitry receives a data at a HIGH level, or connecting a ground 27 to the output terminal 19 when the buffer circuitry receives a data at a LOW level, 23 denotes an inverter for inverting the output signal of the NAND gate 21, 24 denotes a NAND gate for implementing the logical NAND operation on an output signal from the inverter 23 and the data applied thereto, 25 denotes a NOR gate for implementing the logical NOR operation on the output signal from the NAND gate 21 and the data applied thereto, 28 denotes a P-channel transistor that is turned on when its base terminal makes a HIGH to LOW transition, and that is turned off when the base terminal makes a LOW to HIGH transition, and 29 denotes an N-channel transistor that is turned on when its base terminal makes a LOW to HIGH transition, and that is turned off when the base terminal makes a HIGH to LOW transition.

Figure 2:
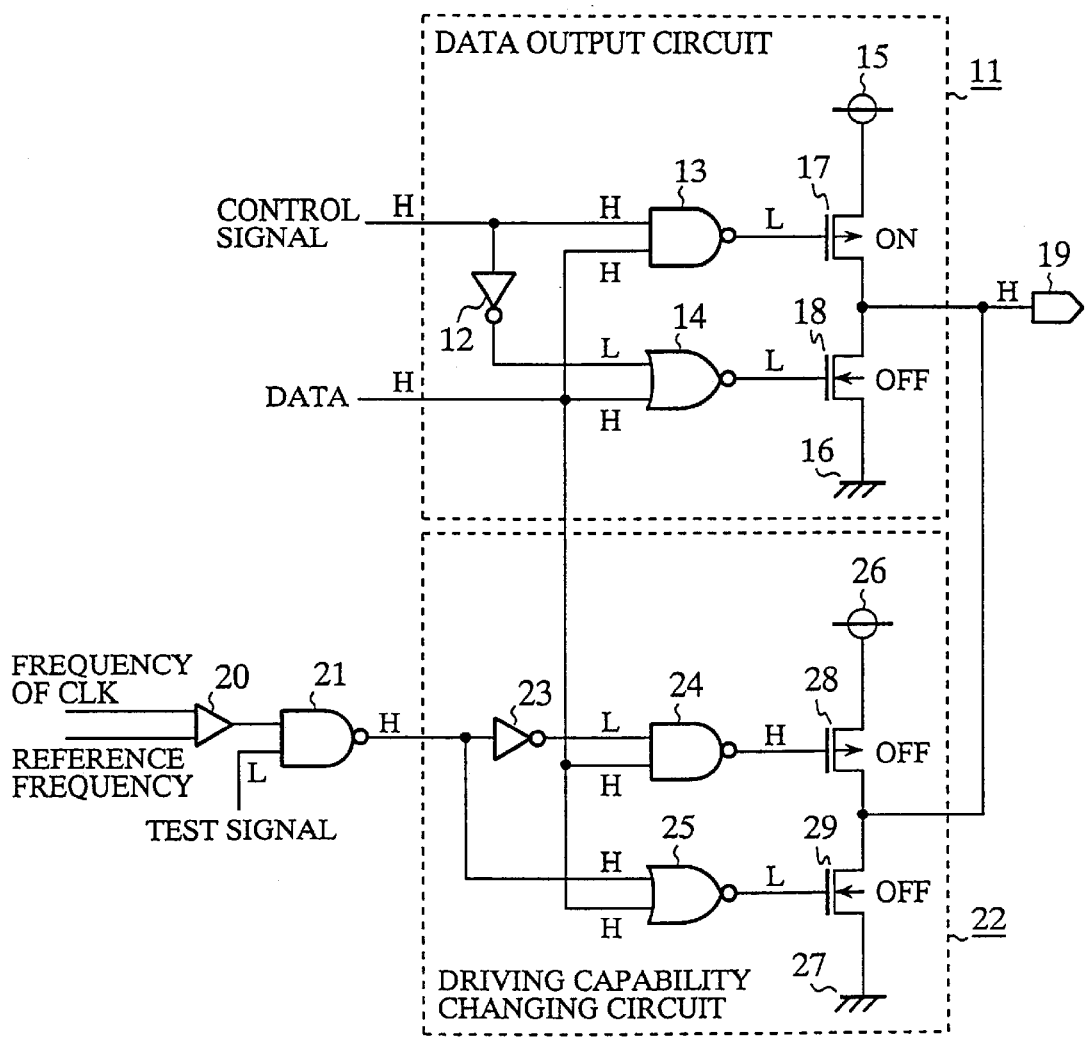
FIG. 2 is a schematic circuit diagram showing an operation of the buffer circuitry of the first embodiment that is placed in normal mode when the buffer circuitry receives a data at a HIGH level.

When the data output circuit 11 of the buffer circuitry receives a data at a HIGH level, the P-channel transistor 17 is brought into its ON state and the N-channel transistor 18 is brought into its OFF state, as shown in FIG. 2, provided that the control signal is at a HIGH level. In this case, if the buffer circuitry is placed in normal mode in which the checking of the operation of the buffer circuitry is not carried out, the test signal applied to the NAND gate 21 is held at a LOW level. Therefore, the output of the NAND gate 21 goes HIGH and then remains at a HIGH level regardless of the comparison result of the comparator 20. Thus the P-channel transistor 28 of the driving capability changing circuit 22 is brought into its OFF state and the N-channel transistor 29 is also brought into is OFF state.

As a result, the driving capability changing circuit 22 is separated from the buffer circuitry. Furthermore, the output terminal 19 is connected to the first power supply 15 and a signal at a HIGH level is furnished by way of the output terminal because the P-channel transistor 17 is held at its ON state (the N-channel transistor 18 is held at its OFF state).

Figure 3:
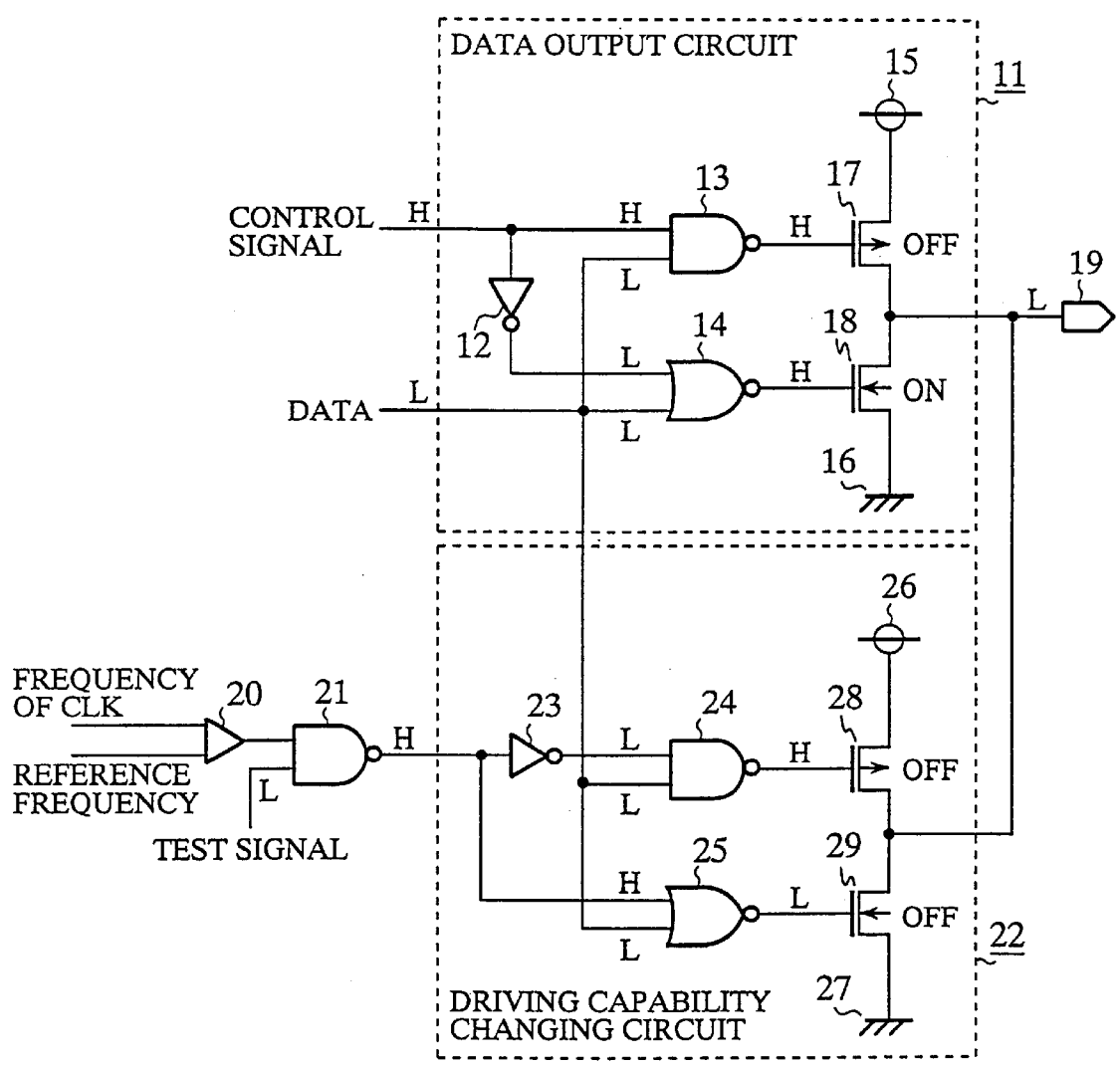
FIG. 3 is a schematic circuit diagram showing an operation of the buffer circuitry of the first embodiment that is placed in normal mode when the buffer circuitry receives a data at a LOW level.

In contrast, when the data output circuit 11 of the buffer circuitry receives a data at a LOW level, the P-channel transistor 17 is brought into its OFF state and the N-channel transistor 18 is brought into its ON state, as shown in FIG. 3, provided that the control signal is at a HIGH level. In this case, if the buffer circuitry is placed in normal mode in which the checking of the condition of the buffer circuitry is not carried out, the test signal applied to the NAND gate 21 is held at a LOW level, as mentioned above. Therefore, the output of the NAND gate 21 goes HIGH and then remains at a HIGH level regardless of the comparison result of the comparator 20. As a result, the P-channel transistor 28 of the driving capability changing circuit 22 is brought into its OFF state and the N-channel transistor 29 is also brought into is OFF state in normal mode. The driving capability changing circuit 22 is thus separated from the buffer circuitry. Furthermore, the output terminal 19 is connected to the ground 16 and a signal at a LOW level is furnished by way of the output terminal 19 because the N-channel transistor 18 is held at its ON state (the P-channel transistor 17 is held at its OFF state).

As previously explained, since the driving capability changing circuit 22 is separated from the buffer circuitry in normal mode in which the checking of the condition of the buffer circuitry is not carried out, the driving capability of the buffer circuitry cannot be increased in normal mode. In contrast, when the buffer circuitry is switched into test mode in which the checking of the condition of the buffer circuitry is carried out, the driving capability changing circuit 22 can be connected to the buffer circuitry under a certain condition and the driving capability of the buffer circuitry can be therefore increased, as will be explained below.

Figure 8A:
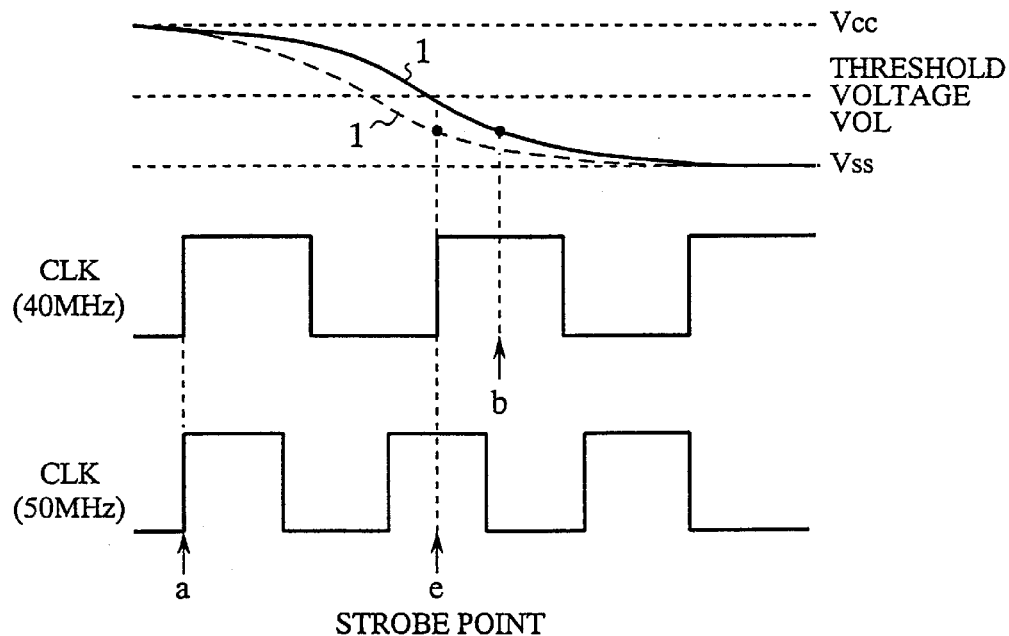
FIG. 8($a$) is a diagram showing a method of testing the buffer circuitry of the first embodiment when a data applied to the buffer circuitry makes a HIGH to LOW transition.
Figure 8B:
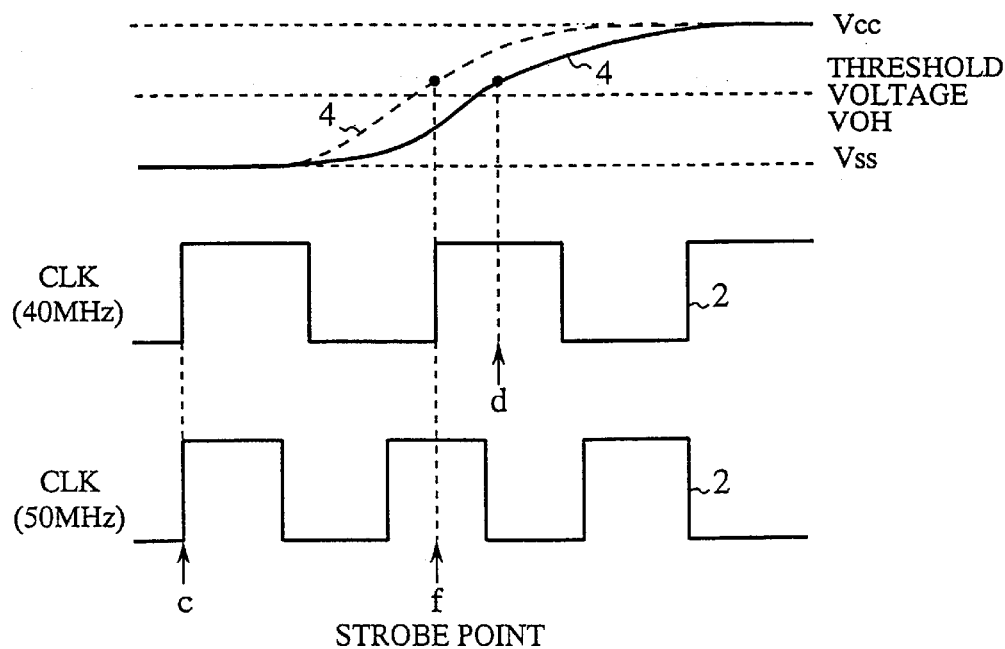

In test mode, the comparison between the potential of the data furnished by the output terminal and a threshold voltage has to be carried out at a strobe point in order to check whether or not the condition of the buffer circuitry is good. As shown in FIGS. 8(a) and 8(b), as the frequency of CLK is increased, the strobe point is brought forward to an earlier time: the strobe point b is moved to point e and the strobe point d is moved to point f. Accordingly, unless the driving capability of the buffer circuit is increased in order to increase the rate of change in the potential of the data such that the waveforms 1 and 4 of the data are changed from the ones shown by the solid lines to the other ones shown by the dashed lines, respectively, as shown in FIGS. 8(a) and 8(b), the result of checking the condition of the buffer circuitry would be wrong.

Figure 6:
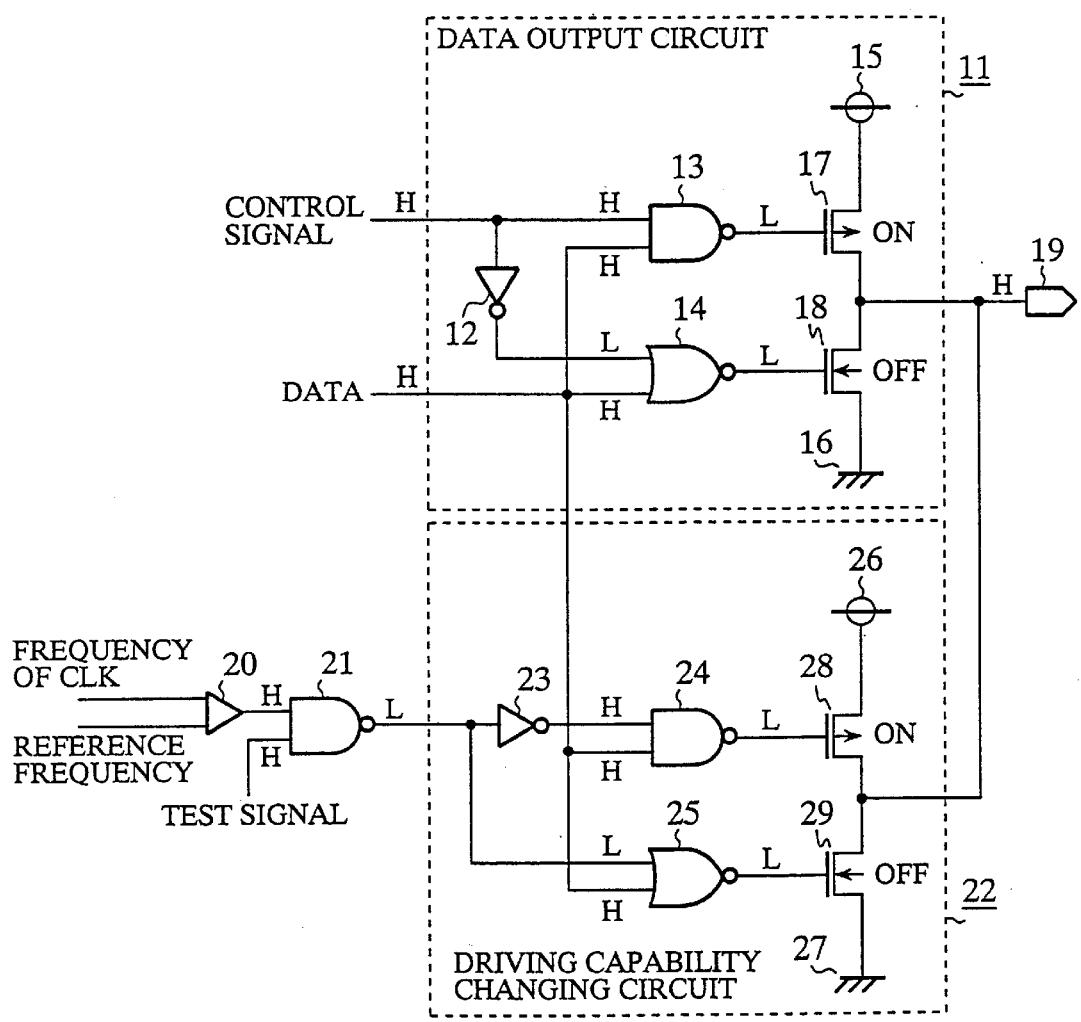
FIG. 6 is a schematic circuit diagram showing an operation of the buffer circuitry of the first embodiment that is placed in test mode when the buffer circuitry receives a data at a HIGH level and when the frequency of the clock signal is greater than the reference frequency.

The driving capability changing circuit 22 can be connected to the buffer circuitry under a certain condition in order to improve the driving capability of the buffer circuitry. To be more specific, in test mode in which the checking of the condition of the buffer circuitry is carried out, the test signal applied to the NAND gate 21 goes HIGH and is held at a HIGH level. For example, when the frequency of CLK is greater than the reference frequency (e.g. 45 MHz), the comparator 20 furnishes an output signal at a HIGH level. In this case, when the buffer circuitry receives a data at a HIGH level, the P-channel transistor 28 of the driving capability changing circuit is brought into its ON state and the N-channel transistor 29 is brought into its OFF state, as shown in FIG. 6.

As a result, the output terminal 19 is connected to the first power supply 15 and is also connected to the second power supply 26 of the driving capability changing circuit. In this case, the buffer circuitry furnishes an output signal at a HIGH level by way of the output terminal 19 with its driving capability being improved, because the output terminal 19 is connected to both the first and second power supplies 15 and 26. The driving capability of the buffer circuitry is determined by the potentials of the two power supplies 15 and 26 and the on-resistance values of the two P-channel transistors 17 and 28. Because the amount of output current is increased as compared with the case that the output terminal 19 is connected to only the first power supply 15, the driving capability of the buffer circuitry is increased in test mode. As shown in FIG. 8(b), the waveform 4 of the data furnished via the output terminal 19 is changed from the one shown by the solid line to the other one shown by the dashed line.

Figure 7:
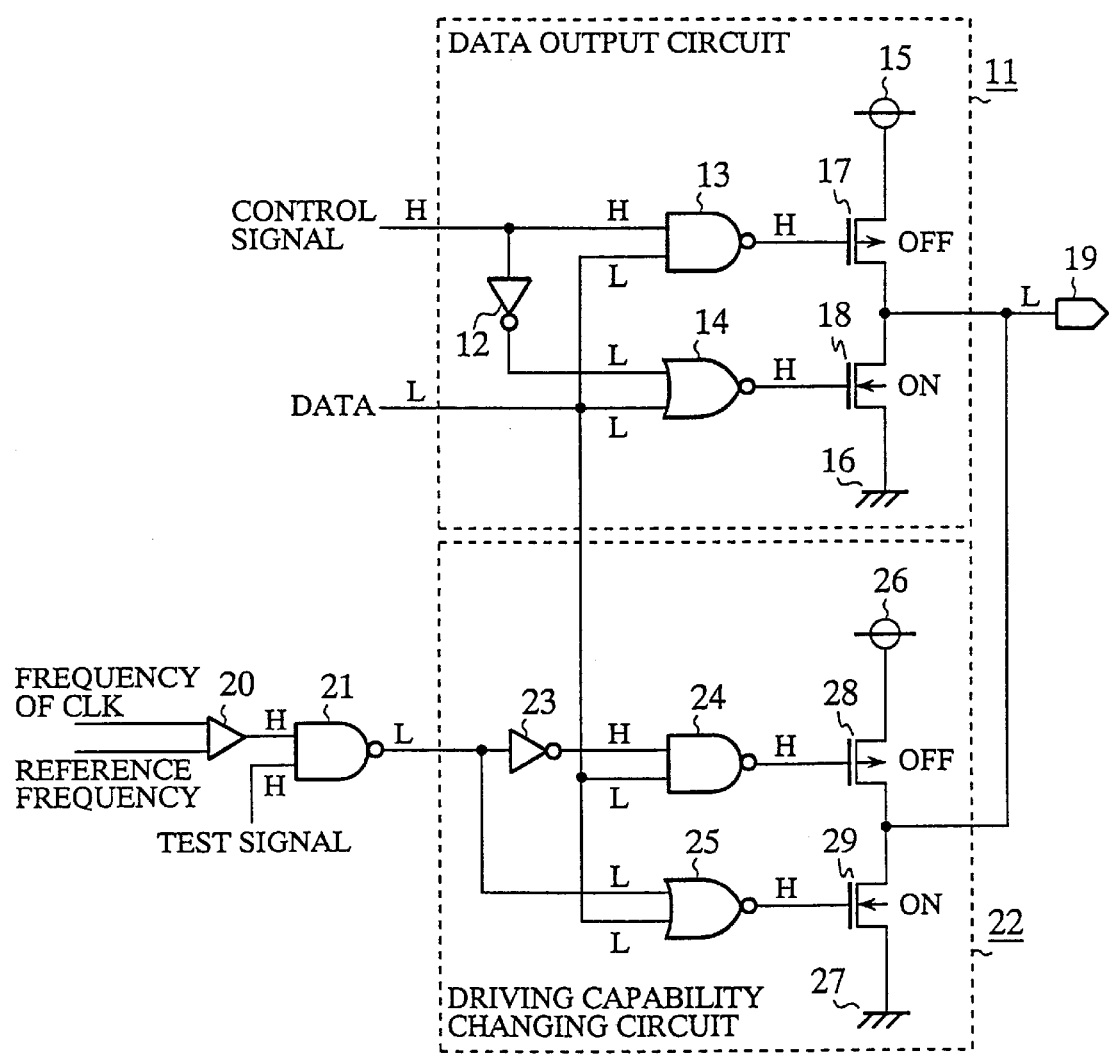
FIG. 7 is a schematic circuit diagram showing an operation of the buffer circuitry of the first embodiment that is placed in test mode when the buffer circuitry receives a data at a LOW level and when the frequency of the clock signal is greater than the reference frequency.

When the frequency of CLK is greater than the reference frequency (e.g. 45 MHz), the P-channel transistor 28 of the driving capability changing circuit is brought into its OFF state and the N-channel transistor 29 is brought into its ON state if the buffer circuitry receives a data at a LOW level, as shown in FIG. 7. As a result, the output terminal 19 is connected to the ground 16 and is also connected to the ground 27 of the driving capability changing circuit. In this case, the buffer circuitry furnishes an output signal at a LOW level by way of the output terminal 19 with its driving capability being improved, because the output terminal 19 is connected to both the grounds 16 and 27. As shown in FIG. 8(a), the waveform 1 of the data furnished via the output terminal 19 is changed from the one shown by the solid line to the other one shown by the dashed line.

Figure 4:
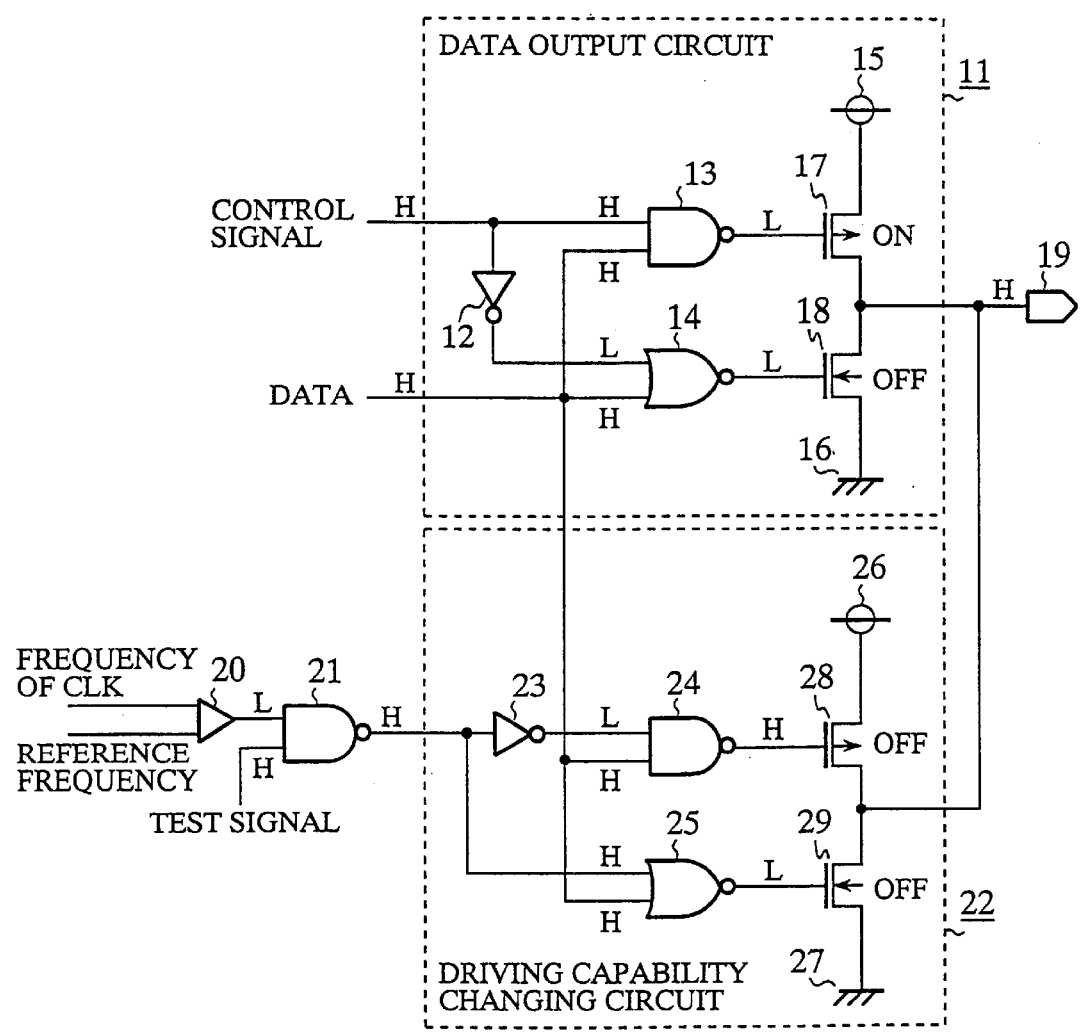
FIG. 4 is a schematic circuit diagram showing an operation of the buffer circuitry of the first embodiment that is placed in test mode when the buffer circuitry receives a data at a HIGH level and when the frequency of a clock signal is less than or equal to a reference frequency.
Figure 5:
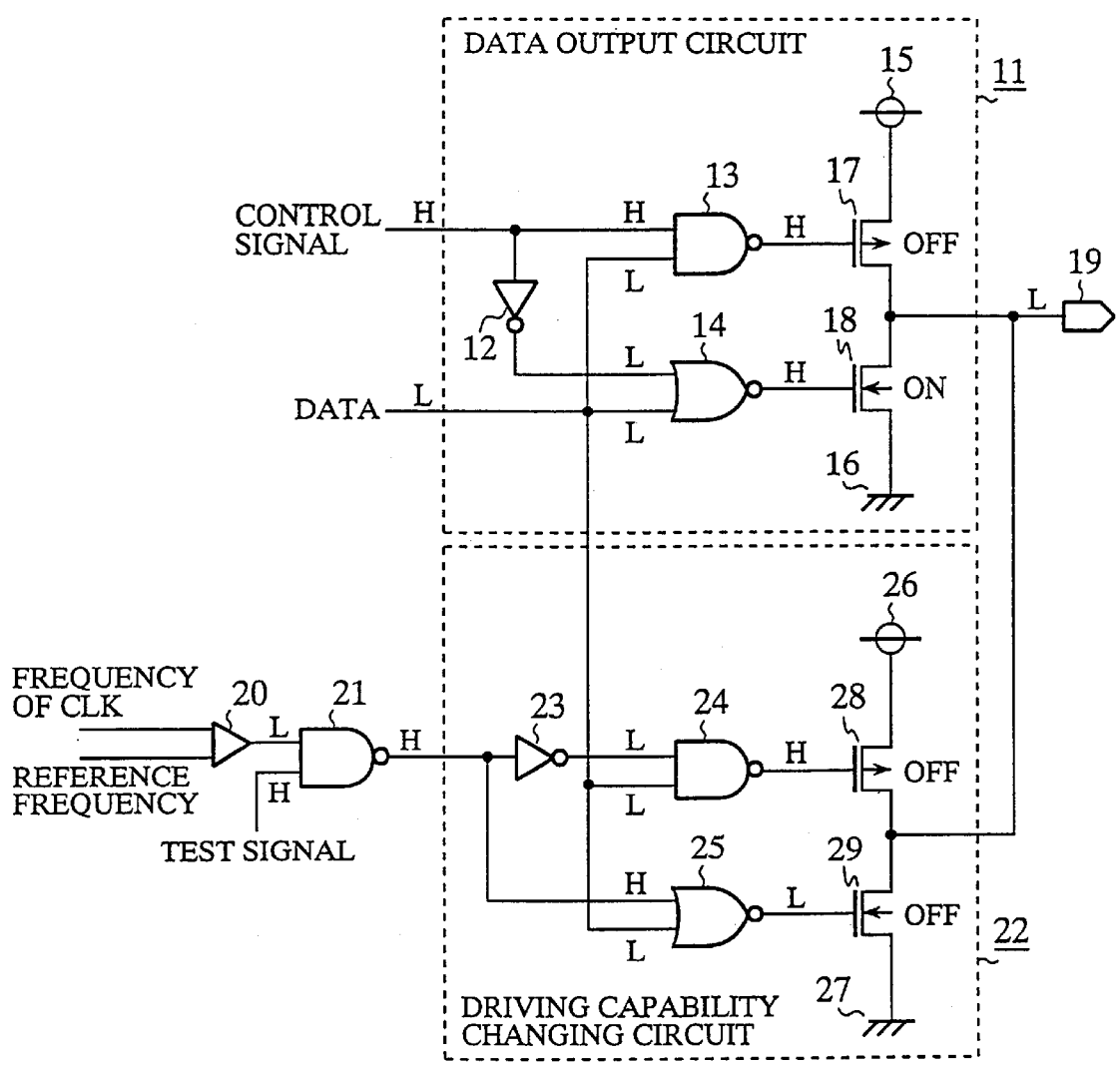
FIG. 5 is a schematic circuit diagram showing an operation of the buffer circuitry of the first embodiment that is placed in test mode when the buffer circuitry receives a data at a LOW level and when the frequency of the clock signal is less than or equal to the reference frequency.

As previously explained, when the frequency of CLK is greater than the reference frequency, the NAND circuit 21 activates the driving capability changing circuit 22 only if the buffer circuitry is placed in test mode to check for operation of the buffer circuitry. However, even in test mode, since the comparator 20 furnishes a signal at a LOW level and hence the NAND gate 21 furnishes an output signal at a HIGH level when the frequency of CLK is less than or equal to the reference frequency (e.g. 45 MHz), both the P-channel transistor 28 and the N-channel transistor 29 are brought into their OFF state regardless of the level of a data applied to the buffer circuitry, as shown in FIGS. 4 and 5. In this case, the driving capability changing circuit 22 is thus brought into a state in which it is deactivated and separated from the buffer circuitry, and therefore the driving capability of the buffer circuitry is not improved.

As previously mentioned, in accordance with the first embodiment of the present invention, only if the frequency of CLK is greater than the reference frequency, the buffer circuitry can connect the second power supply 26 to the output terminal when it receives an incoming data at a HIGH level, whereas it can connect the ground 27 to the output terminal when it receives an incoming data at a LOW level. As a result, the buffer circuitry can change the strobe point without having to change the test program. The first embodiment of the present invention thus offers the advantage of being able to check the condition of the buffer circuitry at once even if the frequency of CLK is varied.

Second Embodiment

Figure 9:
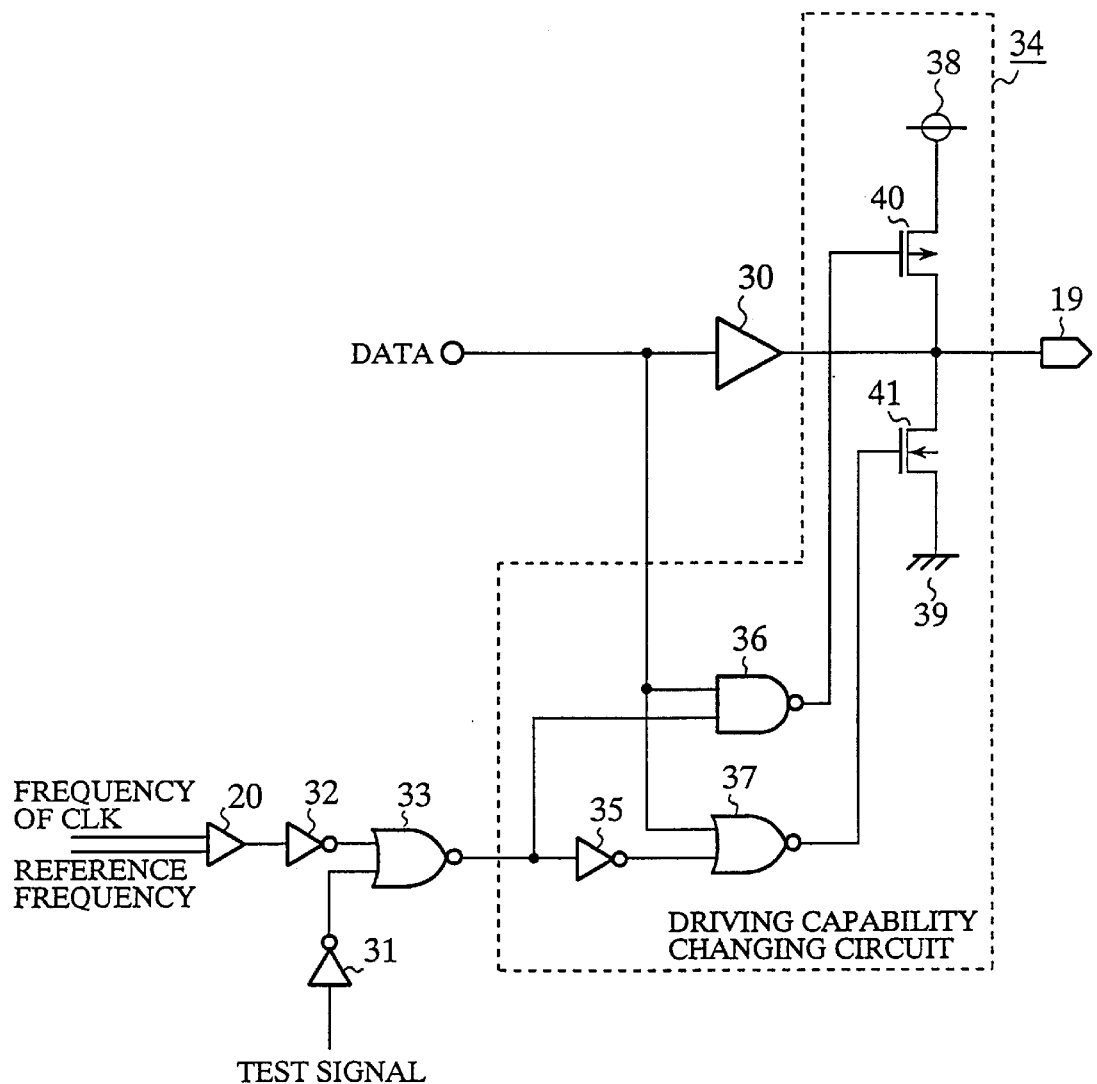
FIG. 9 is a schematic circuit diagram showing the structure of buffer circuitry according to a second embodiment of the present invention.

Referring next to FIG. 9, there is illustrated a schematic circuit diagram showing the structure of buffer circuitry according to a second embodiment of the present invention. In the figure, the same reference numerals as shown in FIG. 1 designate the same elements as those of the buffer circuitry of the aforementioned first embodiment or like elements, and therefore the description of those elements will be omitted hereinafter.

In FIG. 9, reference numeral 30 denotes a buffer for furnishing a data applied thereto to an output terminal 19, 31 denotes an inverter for inverting a test signal applied thereto, 32 denotes another inverter for inverting an output signal from a comparator 20, 33 denotes a NOR gate for implementing the logical NOR operation on an output signal from the inverter 31 and an output signal from the inverter 32 applied thereto, and 34 denotes a driving capability changing circuit for, only if the NOR gate 33 furnishes an output signal at a HIGH level, connecting a power supply 38 to the output terminal 19 when receiving a data at a HIGH level from the buffer 30, or connecting a ground 39 to the output terminal 19 when receiving a data at a LOW level from the buffer 30.

In addition, reference numeral 35 denotes an inverter for inverting the output signal of the NOR gate 33, 36 denotes a NAND gate for implementing the logical NAND operation on an output signal from the NOR gate 33 and the data applied thereto, 37 denotes a NOR gate for implementing the logical NOR operation on an output signal from the inverter 35 and the data applied thereto, 40 denotes a P-channel transistor that is turned on when its base terminal makes a HIGH to LOW transition, and that is turned off when the base terminal makes a LOW to HIGH transition, and 41 denotes an N-channel transistor that is turned on when its base terminal makes a LOW to HIGH transition, and that is turned off when the base terminal makes a HIGH to LOW transition.

Figure 10:
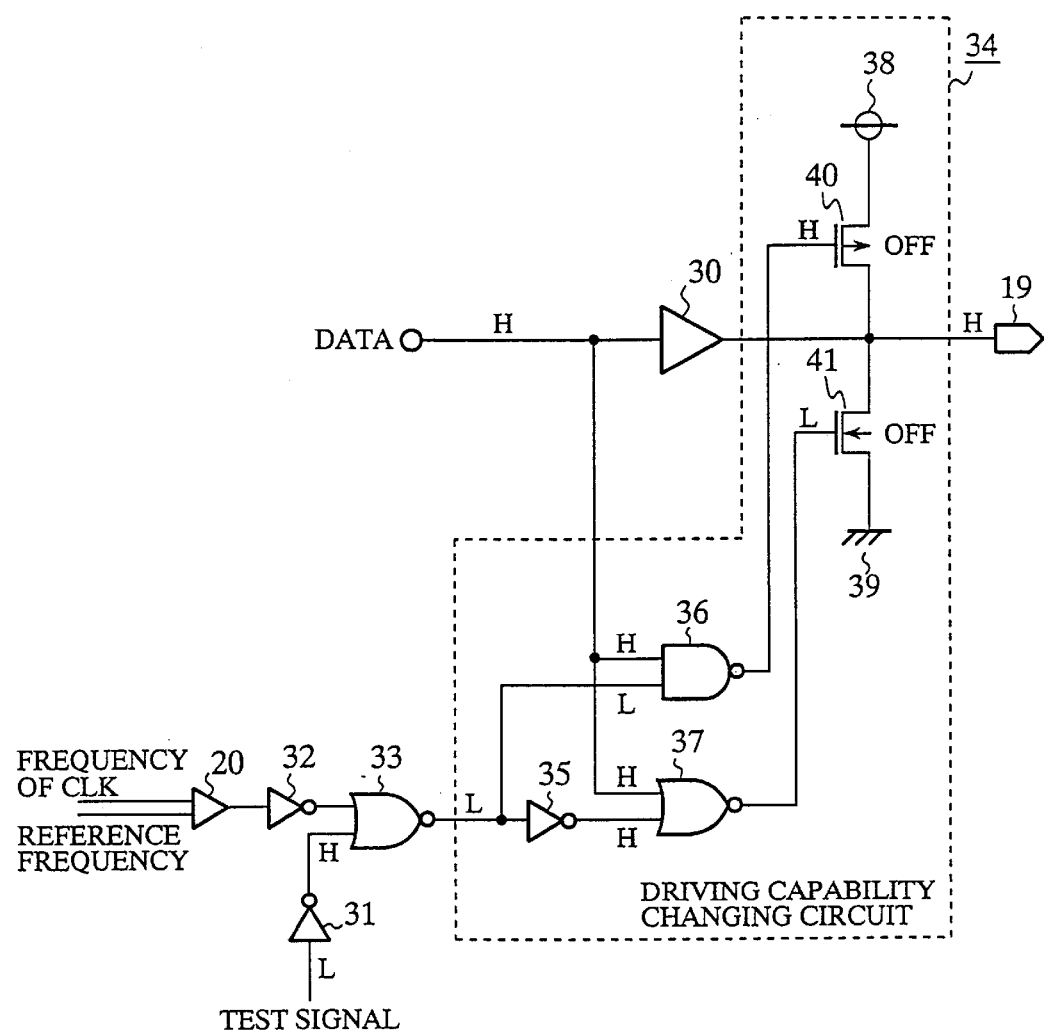
FIG. 10 is a schematic circuit diagram showing an operation of the buffer circuitry of the second embodiment that is placed in normal mode when the buffer circuitry receives a data at a HIGH level.
Figure 11:
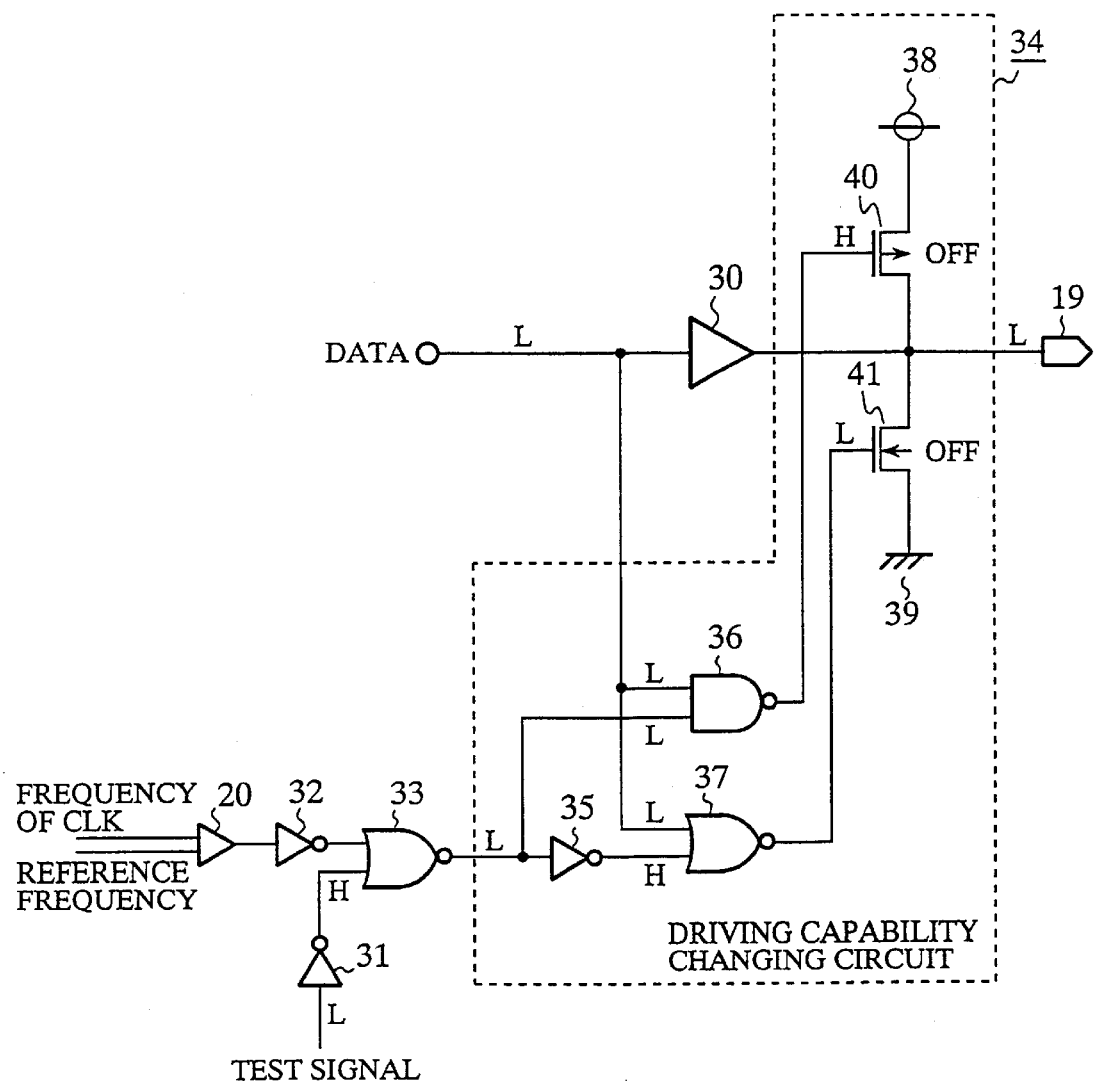
FIG. 11 is a schematic circuit diagram showing an operation of the buffer circuitry of the second embodiment that is placed in normal mode when the buffer circuitry receives a data at a LOW level.

In normal mode in which the checking of the operation of the buffer circuitry is nor carried out, the test signal at a LOW level is applied to the inverter 31 and therefore the inverted test signal at a HIGH level s applied to the NOR gate 33, as shown in FIGS. 10 and 11. Therefore, both the P-channel transistor 40 and the N-channel transistor 41 are held in their OFF state. As a result, the driving capability changing circuit 34 is separated from the buffer circuitry, and therefore the driving capability of the buffer circuitry is not improved. A data input to the buffer 30 is furnished to the output terminal 19, just as it is.

Figure 14:
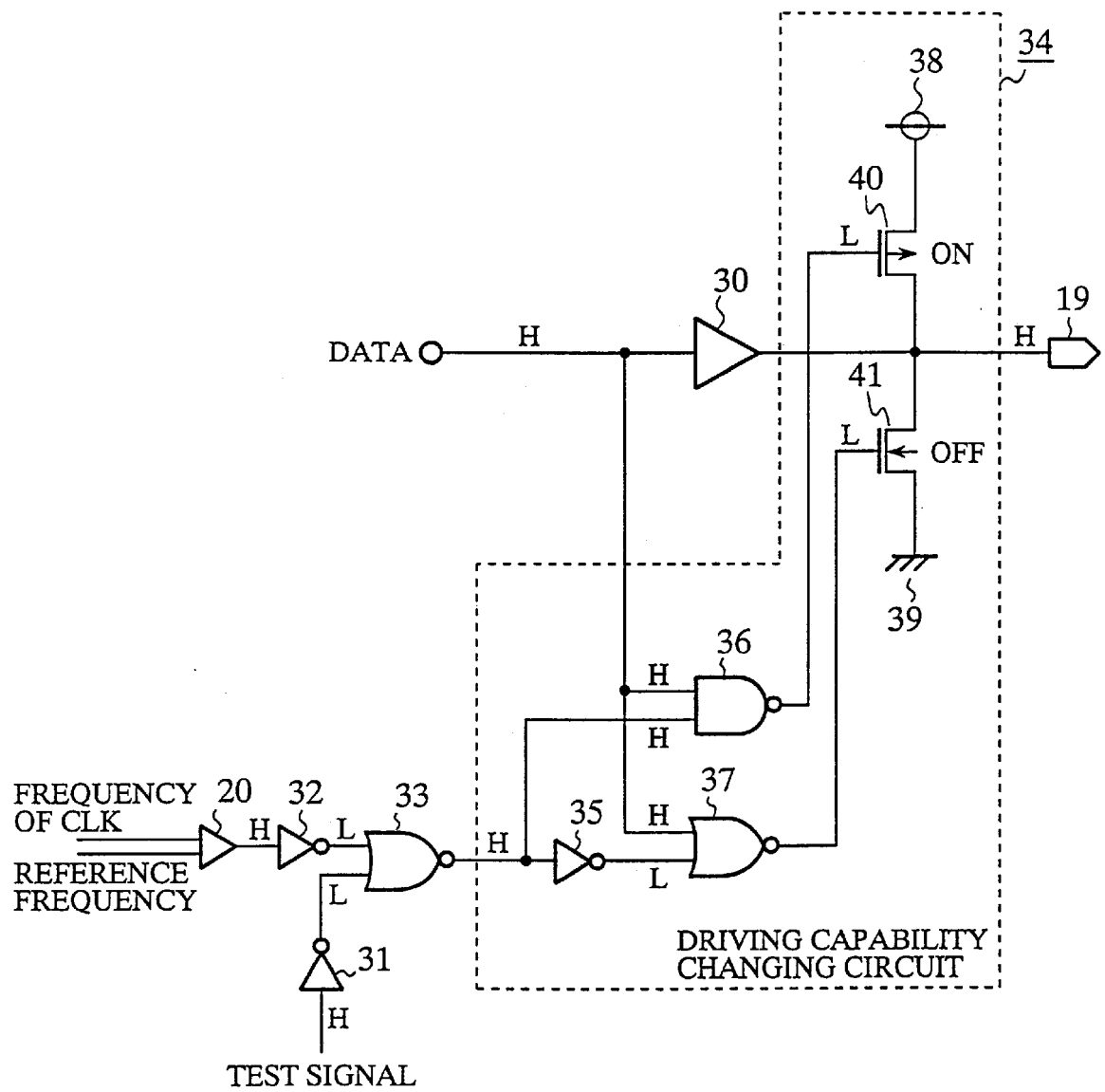
FIG. 14 is a schematic circuit diagram showing an operation of the buffer circuitry of the second embodiment that is placed in test mode when the buffer circuitry receives a data at a HIGH level and when the frequency of the clock signal is greater than the reference frequency.
Figure 16:
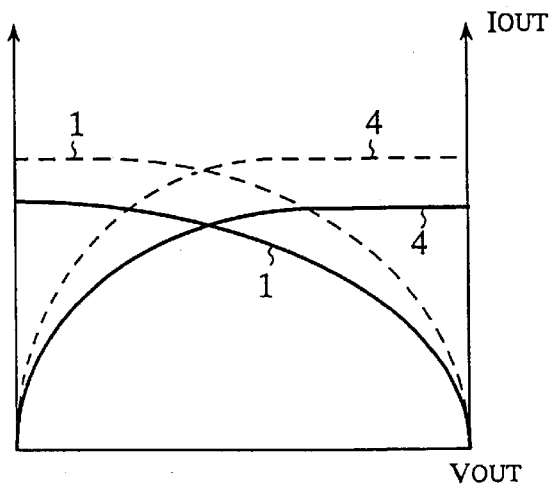
FIG. 16 is a diagram showing the waveforms of data furnished by way of the output terminal of the buffer circuitry of the second embodiment, for explaining the driving capability of the buffer circuitry.

In test mode in which the checking of the condition of the buffer circuitry is carried out, the test signal applied to the inverter 31 is held at a HIGH level and hence the output of the inverter 31 held at a LOW level is applied to the NOR gate 33. For example, when the frequency of CLK is greater than the reference frequency (e.g. 45 MHz), the comparator 20 furnishes an output signal at a HIGH level. In this case, when the buffer circuitry receives a data at a HIGH level, the P-channel transistor 40 of the driving capability changing circuit is brought into its ON state and the N-channel transistor 41 is brought into its OFF state, as shown in FIG. 14. As a result, the output terminal 19 is connected to the power supply 38, and the driving capability of the buffer circuitry is therefore increased as compared with the case that the output terminal 19 is not connected to the power supply 38 in normal mode. The waveform 4 of the data furnished via the output terminal 19 is thus changed from the one shown by the solid line to the other one shown by the dashed line as shown in FIG. 16.

Figure 15:
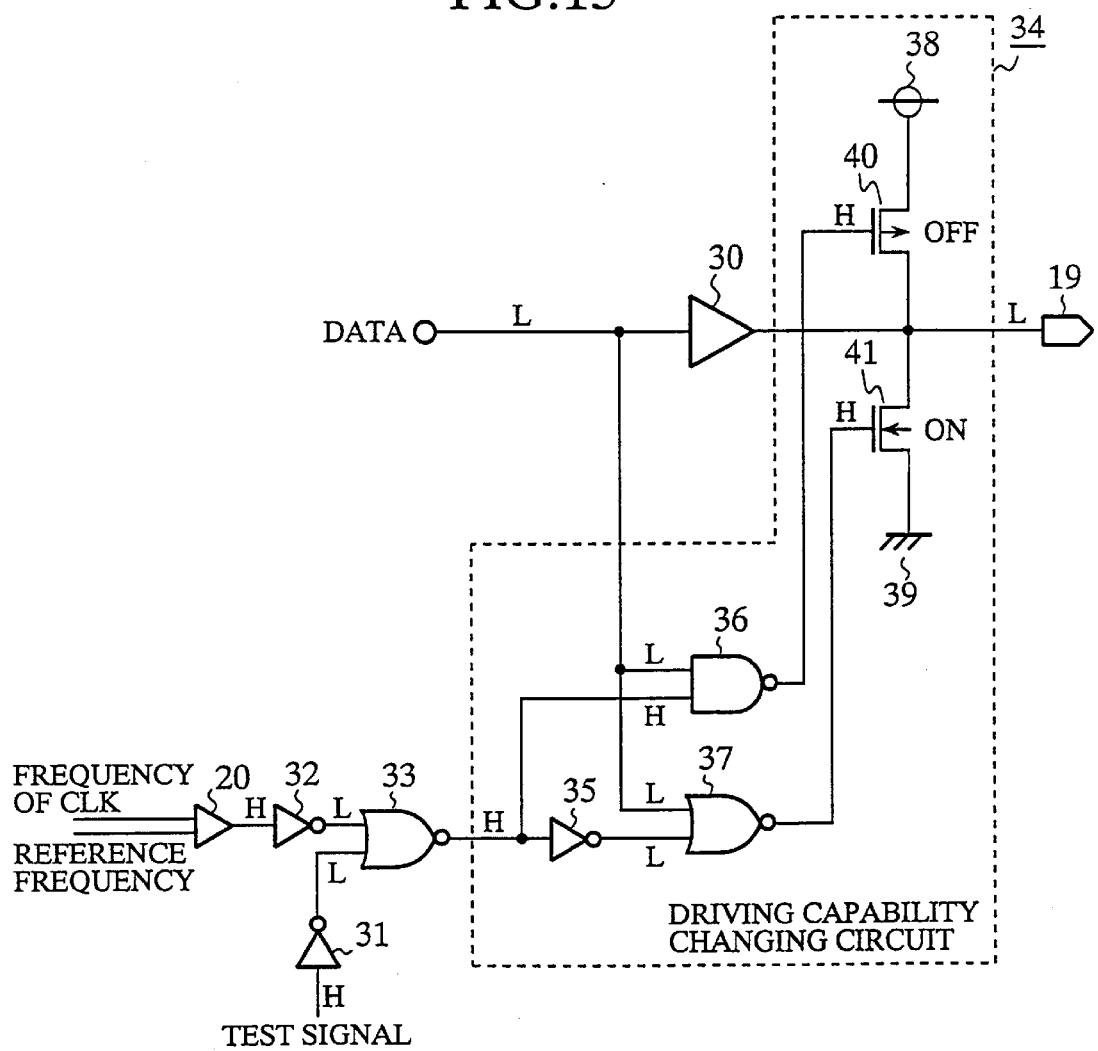
FIG. 15 is a schematic circuit diagram showing an operation of the buffer circuitry of the second embodiment that is placed in test mode when the buffer circuitry receives a data at a LOW level and when the frequency of the clock signal is greater than the reference frequency.

The P-channel transistor 40 of the driving capability changing circuit is brought into its OFF state and the N-channel transistor 41 is brought into its ON state if the buffer circuitry receives a data at a LOW level, as shown in FIG. 15, when the frequency of CLK is greater than the reference frequency (e.g. 45 MHz). As a result, the output terminal 19 is connected to the ground 39 and the driving capability of the buffer circuitry is therefore increased as compared with the case that the output terminal 19 is not connected to the ground 39 in normal mode. The waveform 1 of the data furnished via the output terminal 19 is thus changed from the one shown by the solid line to the other one shown by the dashed line as shown in FIG. 16.

Figure 12:
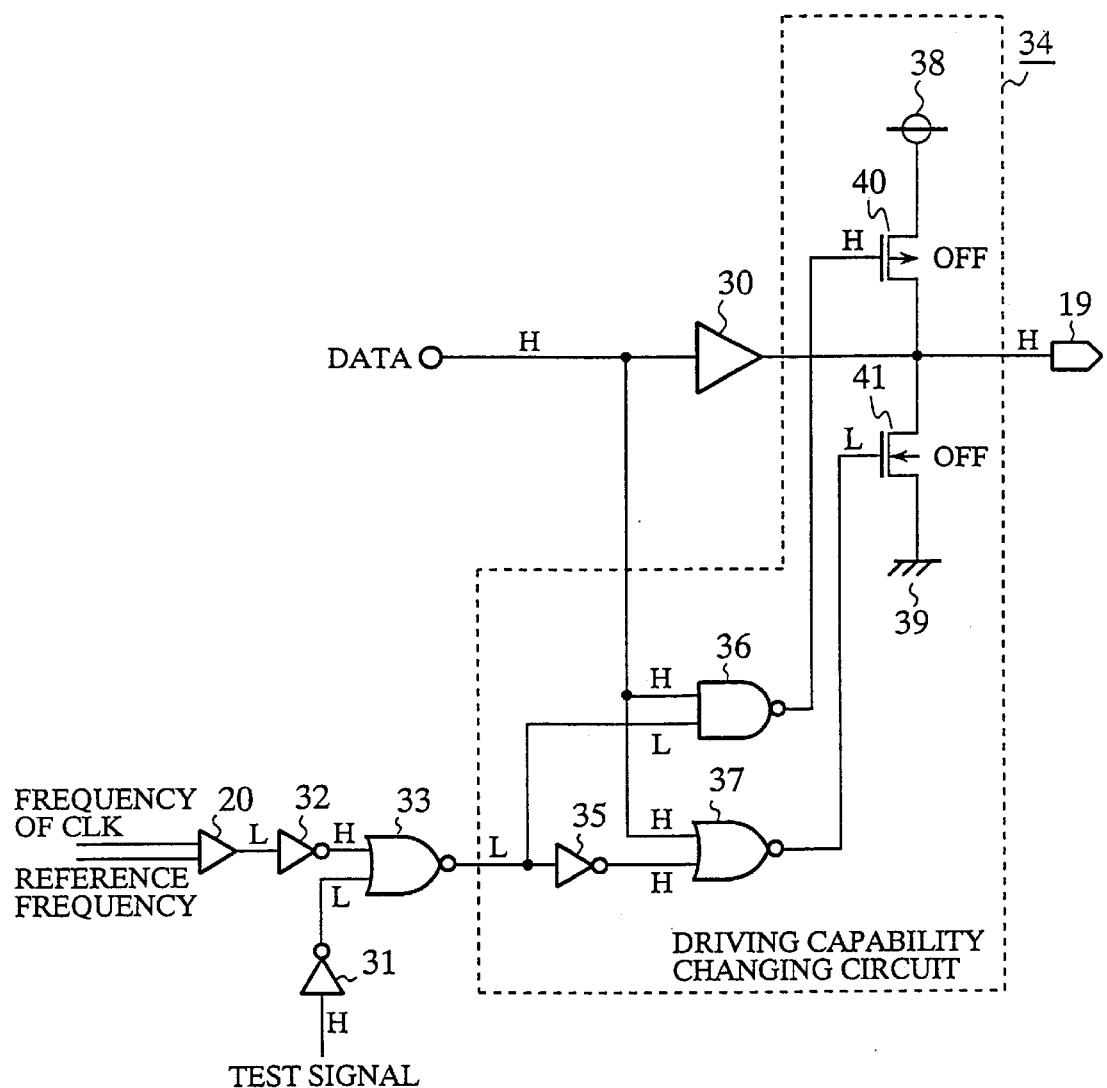
FIG. 12 is a schematic circuit diagram showing an operation of the buffer circuitry of the second embodiment that is placed in test mode when the buffer circuitry receives a data at a HIGH level and when the frequency of the clock signal is less than or equal to the reference frequency.
Figure 13:
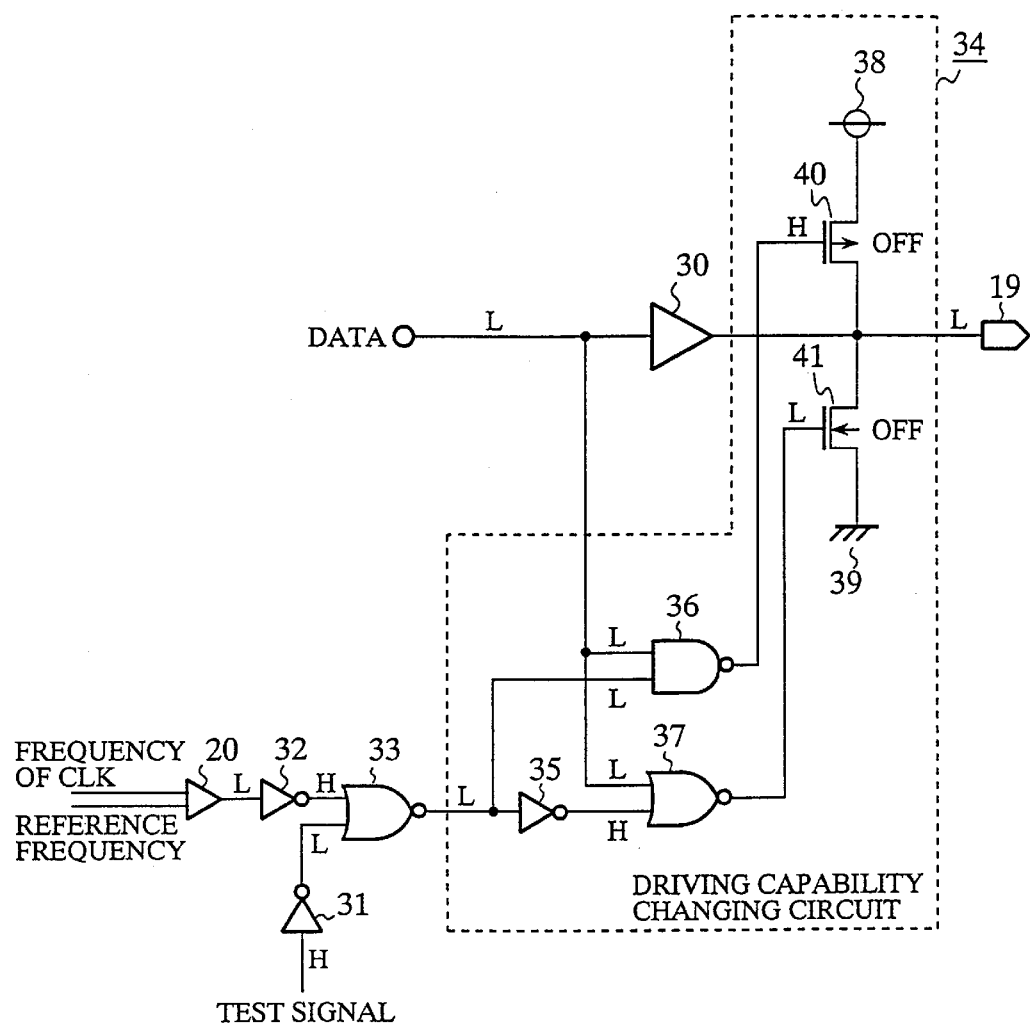
FIG. 13 is a schematic circuit diagram showing an operation of the buffer circuitry of the second embodiment that is placed in test mode when the buffer circuitry receives a data at a LOW level and when the frequency of the clock signal is less than or equal to the reference frequency.

As previously explained, when the frequency of CLK is greater than the reference frequency, the NOR circuit 33 activates the driving capability changing circuit 34 only if the buffer circuitry is placed in test mode to check for operation of the buffer circuitry. However, even in test mode, since the comparator 20 furnishes a signal at a LOW level and hence the NOR gate 33 furnishes an output signal at a LOW level when the frequency of CLK is less than or equal to the reference frequency (e.g. 45 MHz), both the P-channel transistor 40 and the N-channel transistor 41 are brought into their OFF state regardless of the level of a data applied to the buffer circuitry, as shown in FIGS. 12 and 13. In this case, the driving capability changing circuit 34 is thus brought into a state in which it is deactivated and separated from the buffer circuitry, and therefore the driving capability of the buffer circuitry is not improved. As a result, a data applied to the buffer 30 is furnished to the output terminal 19, just as it is.

As previously mentioned, in accordance with the second embodiment of the present invention, only if the frequency of CLK is greater than the reference frequency, the buffer circuitry can connect the power supply 38 to the output terminal 19 when it receives an incoming data at a HIGH level, whereas it can connect the ground 39 to the output terminal 19 when it receives an incoming data at a LOW level. As a result, the buffer circuitry can change the strobe point without having to change the test program. The second embodiment of the present invention thus offers the advantage of being able to check the condition of the buffer circuitry at once even if the frequency of CLK is varied.

Third Embodiment

Figure 17:
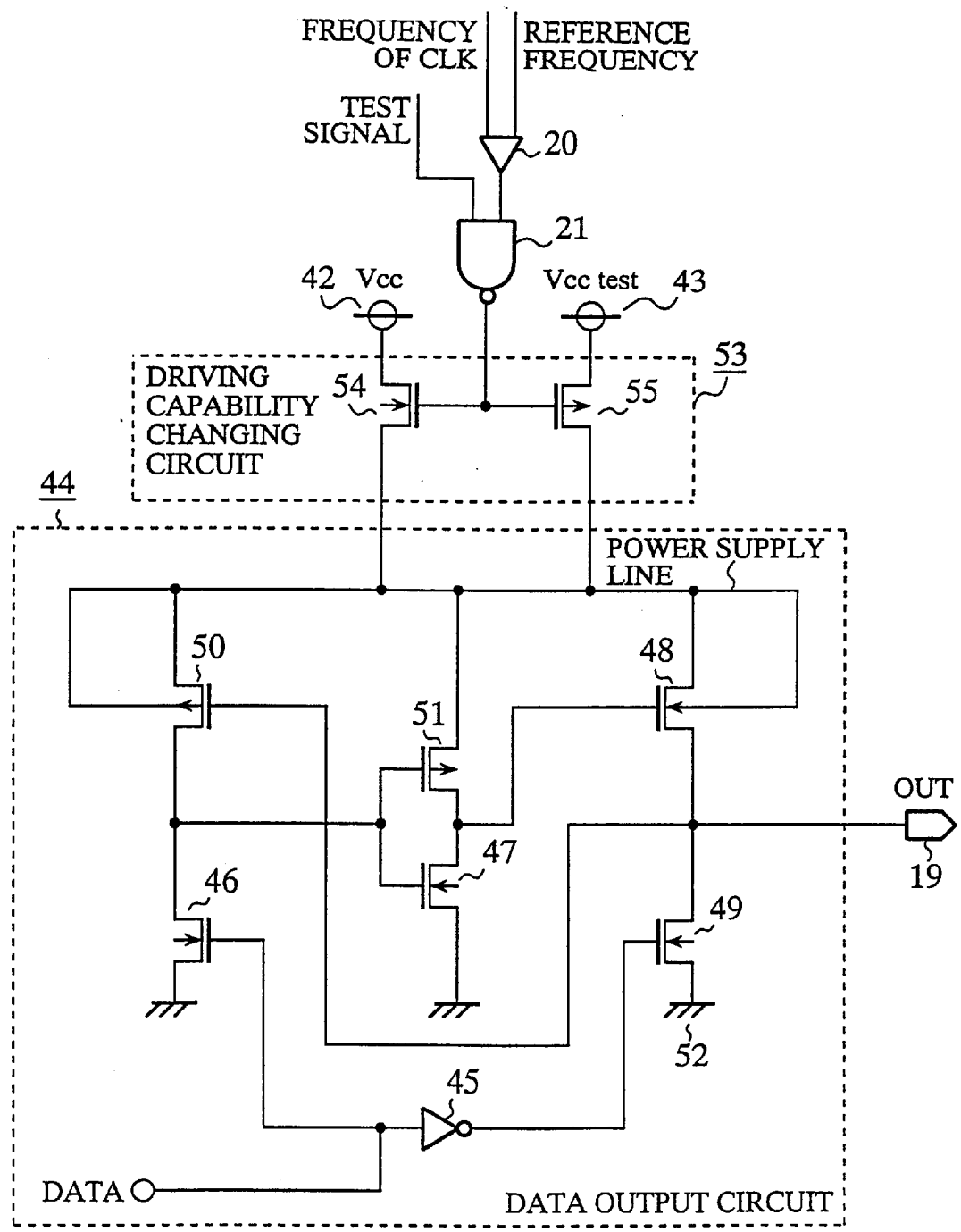
FIG. 17 is a schematic circuit diagram showing the structure of buffer circuitry according to a third embodiment of the present invention.

Referring next to FIG. 17, there is illustrated a schematic circuit diagram showing the structure of buffer circuitry according to a third embodiment of the present invention. In the figure, the same reference numerals as shown in FIG. 1 designate the same elements as those of the buffer circuitry of the aforementioned first embodiment or like elements, and therefore the description of those elements will be omitted hereinafter.

In FIG. 17, reference numeral 42 denotes a first power supply, 43 denotes a second power supply having a higher potential than the first power supply 42, 44 denotes a data output circuit for connecting a power supply line to an output terminal 19 when receiving a data at a HIGH level, or connecting a ground 52 to the output terminal 19 when receiving a data at a LOW level, 45 denotes an inverter for inverting the level of the data applied thereto, 46 to 49 denote N-channel transistors, respectively, and 50 and 51 denote P-channel transistors, respectively.

In addition, reference numeral 53 denotes a driving capability changing circuit for connecting the first power supply 42 to the power supply line of the driving capability changing circuit when the frequency of CLK is less than or equal to a reference frequency, or connecting the second power supply 43 to the power supply line of the driving capability changing circuit when the frequency of CLK is greater than a reference frequency, 54 denotes an N-channel transistor that is turned on when a NAND gate 21 furnishes an output signal at a HIGH level, and that is turned off when the NAND gate 21 furnishes an output signal at a LOW level, and 55 denotes a P-channel transistor that is turned off when the NAND gate 21 furnishes an output signal at a HIGH level, and that is turned on when the NAND gate 21 furnishes an output signal at a LOW level.

Figure 18:
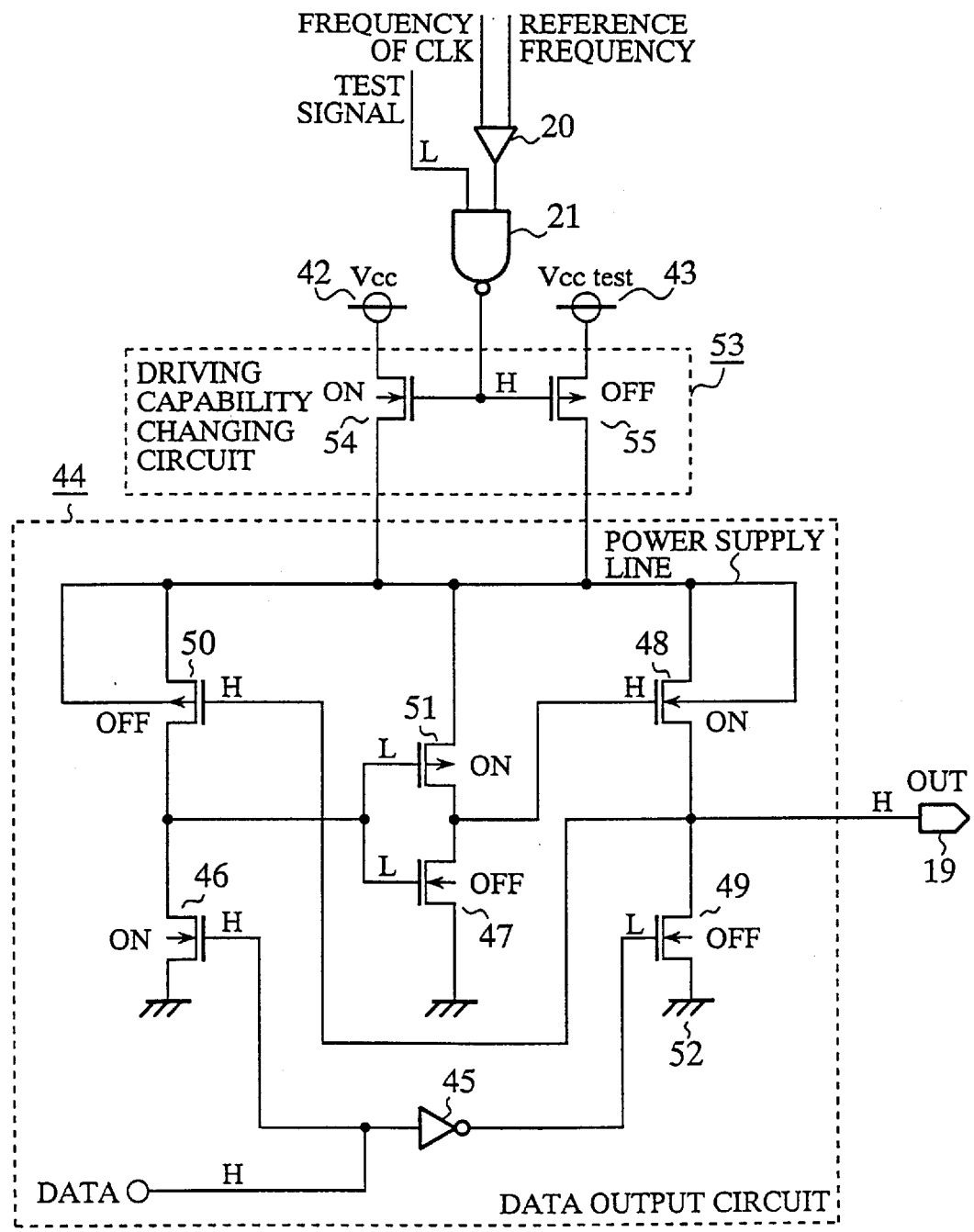
FIG. 18 is a schematic circuit diagram showing an operation of the buffer circuitry of the third embodiment that is placed in normal mode when the buffer circuitry receives a data at a HIGH level.

When the data output circuit 44 of the buffer circuitry receives a data at a HIGH level, the N-channel transistor 48 is brought into its ON state and the N-channel transistor 49 is brought into its OFF state, as shown in FIG. 18. As a result, the power supply line is connected to the output terminal 19, so that the buffer circuitry furnishes an output signal at a HIGH level by way of the output terminal 9. In this case, if the buffer circuitry is placed in normal mode in which the checking of the condition of the buffer circuitry is not carried out, the test signal applied to the NAND gate 21 is held at a LOW level. Therefore, the output of the NAND gate 21 goes HIGH and then remains at a HIGH level regardless of the comparison result of a comparator 20. Then the N-channel transistor 54 of the driving capability changing circuit 53 is brought into its ON state, whereas the P-channel transistor 55 is brought into its OFF state. As a result, the output terminal 19 is connected to the first power supply 42 rather than the second power supply 43. In this case, since the potential of the first power supply 42 is lower than that of the second power supply 43, the driving capability of the buffer circuitry is relatively low (see FIG. 24).

Figure 19:
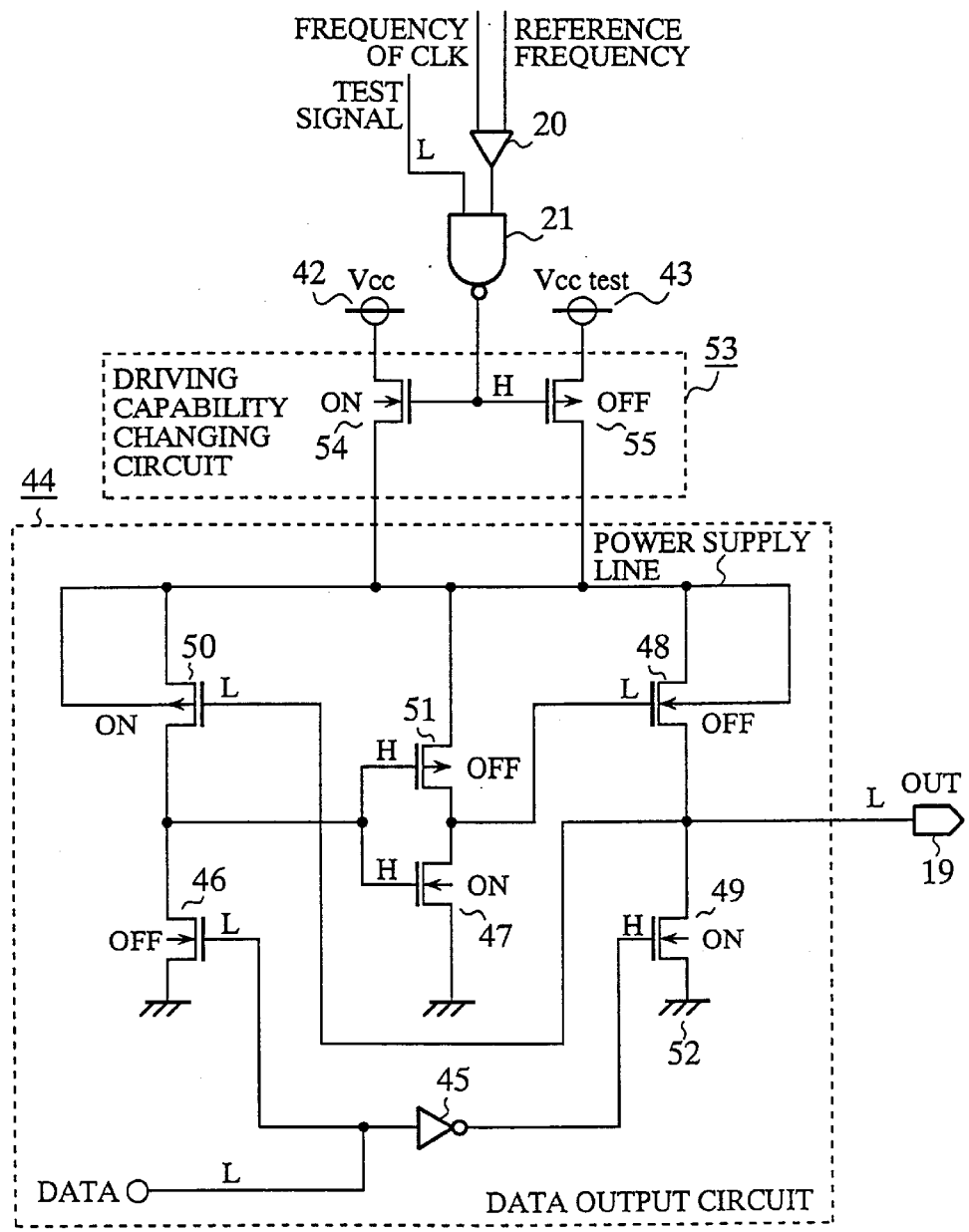
FIG. 19 is a schematic circuit diagram showing an operation of the buffer circuitry of the third embodiment that is placed in normal mode when the buffer circuitry receives a data at a LOW level.
Figure 24:
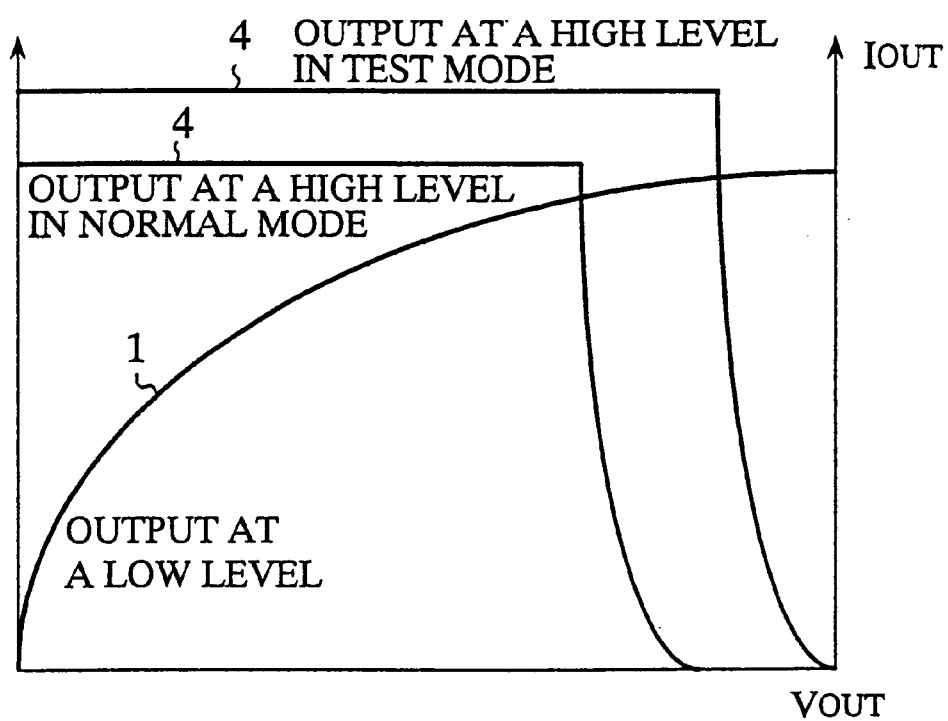
FIG. 24 is a diagram showing the waveforms of data furnished by way of the output terminal of the buffer circuitry of the third embodiment, for explaining the driving capability of the buffer circuitry.

When the data output circuit 44 of the buffer circuitry receives a data at a LOW level, the N-channel transistor 48 is brought into its OFF state and the N-channel transistor 49 is brought into its ON state, as shown in FIG. 19. As a result, the ground 52 is connected to the output terminal 19. The buffer circuitry therefore furnishes an output signal at a LOW level by way of the output terminal 19. In this case, if the buffer circuitry is placed in normal mode in which the checking of the condition of the buffer circuitry is not carried out, the test signal applied to the NAND gate 21 is held at a LOW level, as mentioned above. Therefore, the output of the NAND gate 21 goes HIGH and then remains at a HIGH level regardless of the comparison result of the comparator 20. Then the N-channel transistor 54 of the driving capability changing circuit 53 is brought into its ON state, whereas the P-channel transistor 55 is brought into is OFF state. As a result, the power supply line is connected to the first power supply 42 rather than the second power supply 43, while the ground 52 is connected to the output terminal 19, as mentioned above. In this case, the driving capability of the buffer circuitry is not affected at all. That is, comparing normal mode with test mode, there is no difference in the driving capability of the buffer circuitry, as shown in FIG. 24, when the incoming data is at a LOW level.

As previously explained, in normal mode in which the checking of the condition of the buffer circuitry is not carried out, since the first power supply 42 is connected to the power supply line of the driving capability changing circuit, the driving capability of the buffer circuitry cannot be improved when the buffer circuitry receives a data at a HIGH level. In contrast, when the buffer circuitry is switched into test mode in which the checking of the condition of the buffer circuitry is carried out, the second power supply having a higher potential than the first power supply 42 is connected to the power supply line within the driving capability changing circuit 53 and the driving capability of the buffer circuitry can be therefore increased, as will be mentioned below.

Figure 22:
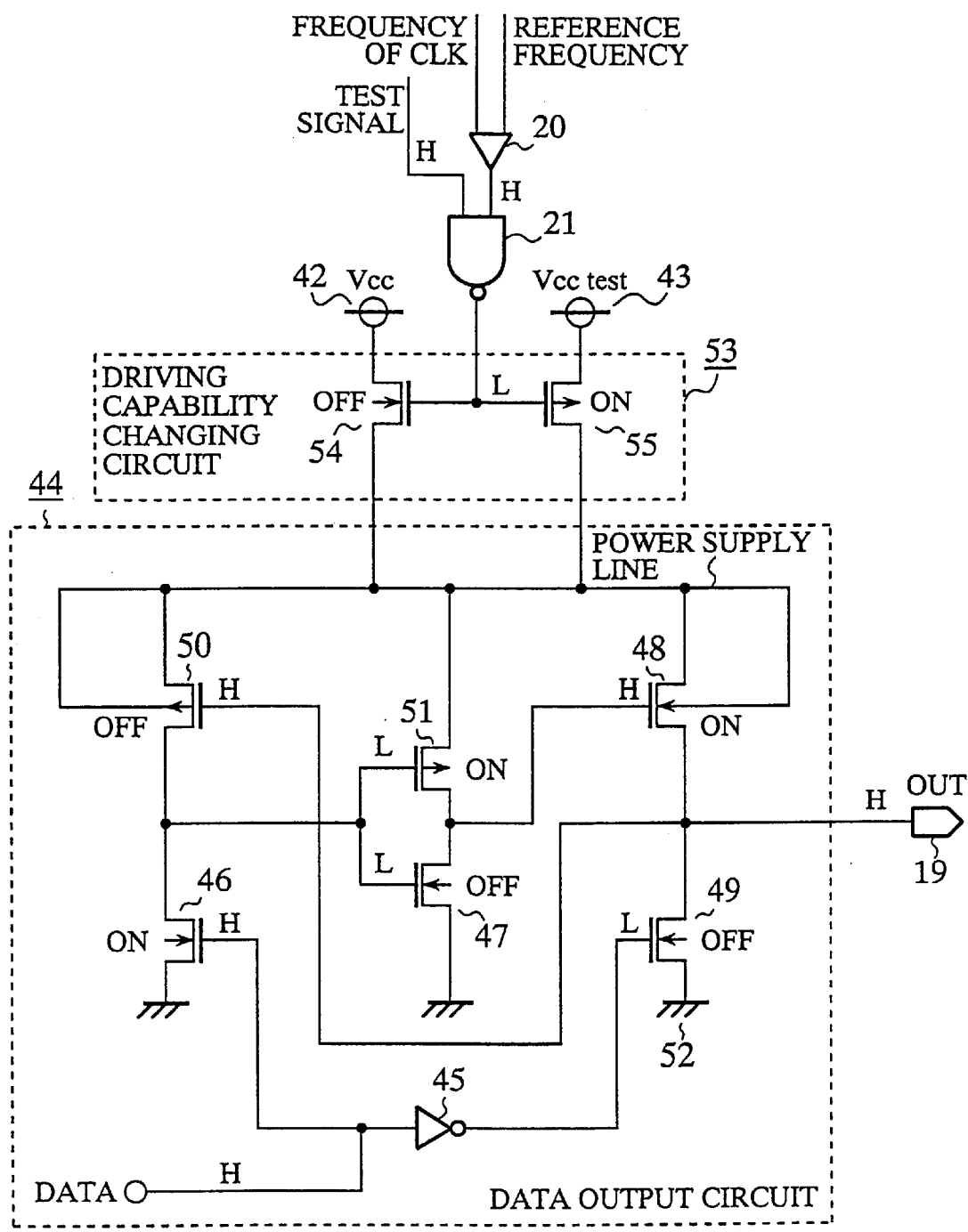
FIG. 22 is a schematic circuit diagram showing an operation of the buffer circuitry of the third embodiment that is placed in test mode when the buffer circuitry receives a data at a HIGH level and when the frequency of the clock signal is greater than the reference frequency.

To be more specific, in test mode in which the checking of the condition of the buffer circuitry is carried out, the test signal applied to the NAND gate 21 goes HIGH and is held at a HIGH level. For example, when the frequency of CLK is greater than the reference frequency (e.g. 45 MHz), the comparator 20 furnishes an output signal at a HIGH level. Then the N-channel transistor 54 of the driving capability changing circuit is brought into its OFF state, whereas the P-channel transistor 55 is brought into its ON state, as shown in FIG. 22. As a result, the power supply line is connected to the second power supply 43 rather than the first power supply 42. In this case, since the second power supply 43 has a larger potential than the first power supply 42, the driving capability of the buffer circuitry can be improved as compared with the case in normal mode. The amount of output current in test mode is increased, as compared with that of output current flowing in normal mode, as shown in FIG. 24, with the increase in the potential of the power supply line.

Figure 23:
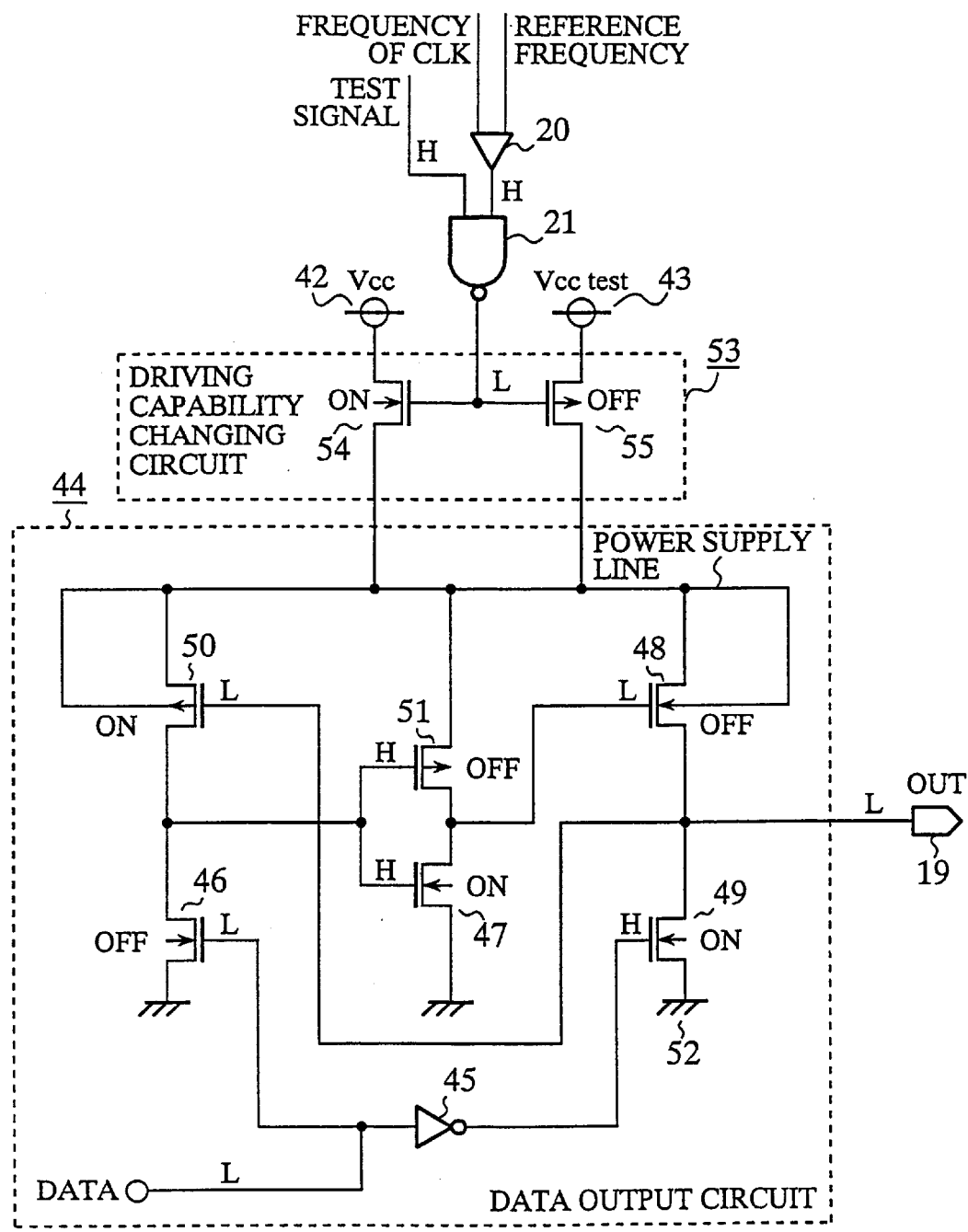
FIG. 23 is a schematic circuit diagram showing an operation of the buffer circuitry of the third embodiment that is placed in test mode when the buffer circuitry receives a data at a LOW level and when the frequency of the clock signal is greater than the reference frequency.

On the other hand, the N-channel transistor 54 of the driving capability changing circuit is brought into its ON state, whereas the P-channel transistor 55 is brought into its OFF state, as shown in FIG. 23, when the buffer circuitry receives a data at a LOW level, in the case that the frequency of CLK is greater than the reference frequency (e.g. 45 MHz). As a result, the power supply line is connected to the first power supply 42 rather than the second power supply 43, while the power supply line is not connected to the output terminal 19, as mentioned above. In this case, the driving capability of the buffer circuitry is not affected at all. That is, comparing normal mode with test mode, there is no difference in the driving capability of the buffer circuitry, as shown in FIG. 24, when the incoming data is at a LOW level.

Figure 20:
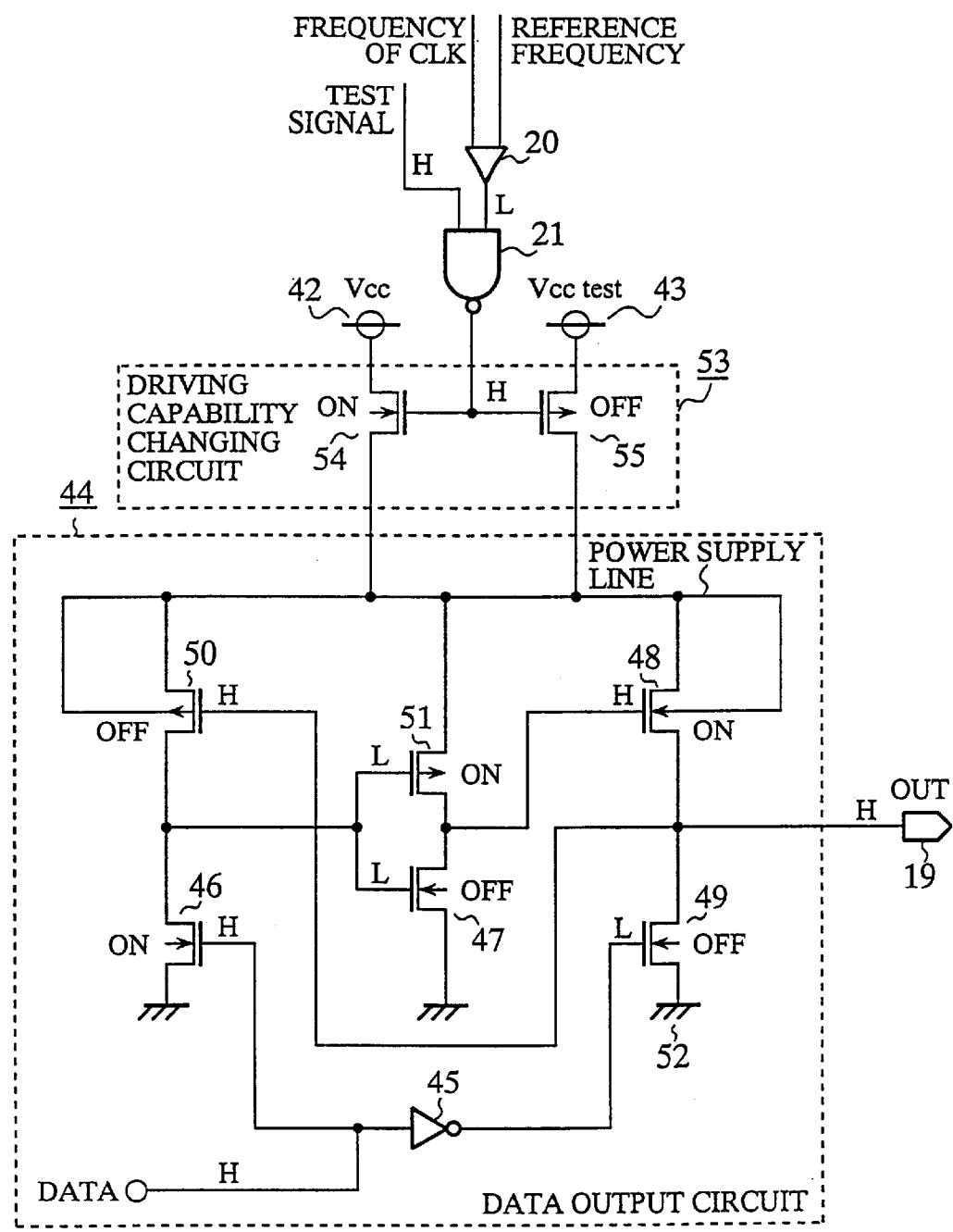
FIG. 20 is a schematic circuit diagram showing an operation of the buffer circuitry of the third embodiment that is placed in test mode when the buffer circuitry receives a data at a HIGH level and when the frequency of the clock signal is less than or equal to the reference frequency.
Figure 21:
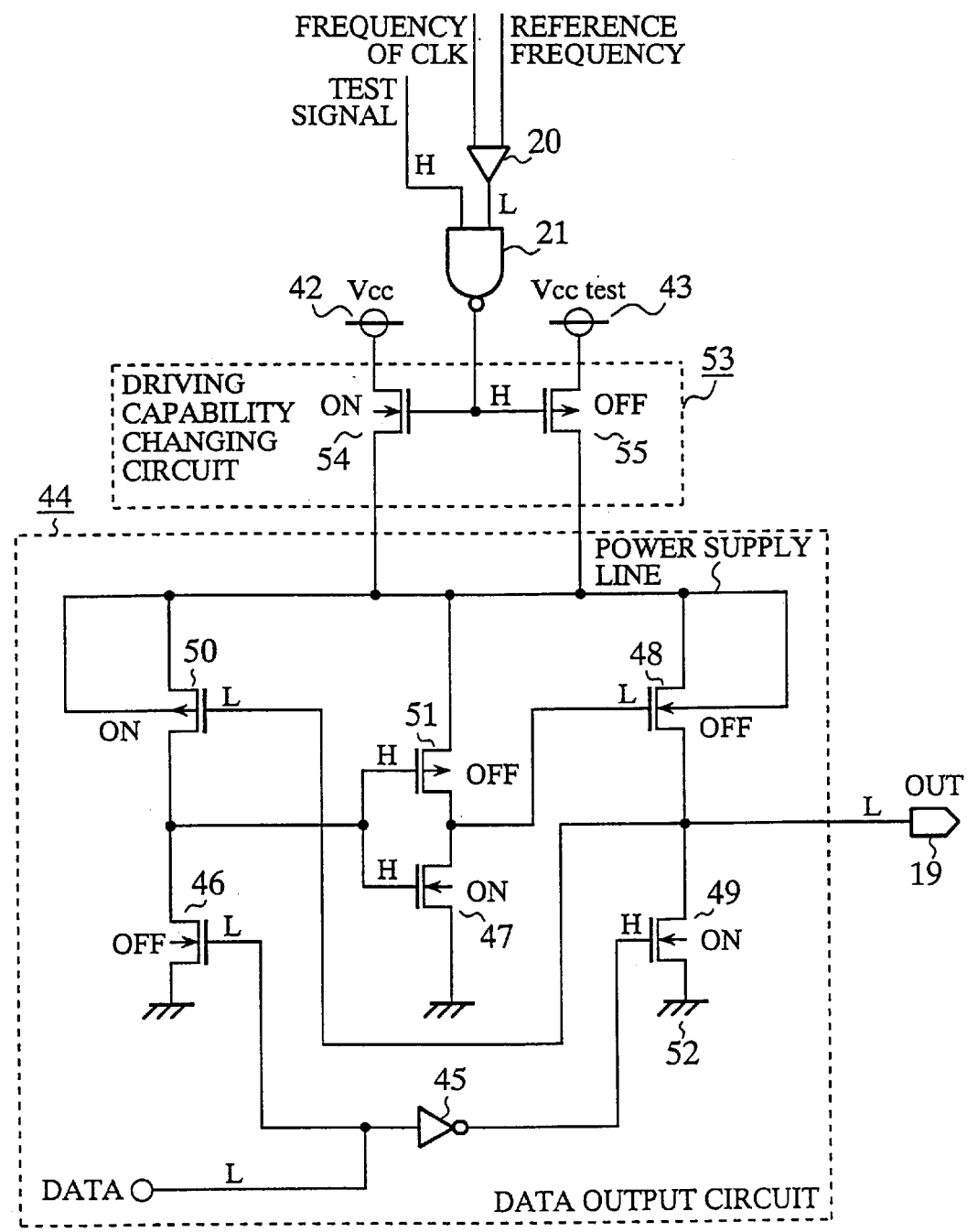
FIG. 21 is a schematic circuit diagram showing an operation of the buffer circuitry of the third embodiment that is placed in test mode when the buffer circuitry receives a data at a LOW level and when the frequency of the clock signal is less than or equal to the reference frequency.

Even in test mode, the comparator 20 furnishes a signal at a LOW level if the frequency of CLK is less than or equal to the reference frequency (e.g. 45 MHz). In this case, since the NAND gate 21 furnishes an output signal at a HIGH level, the N-channel transistor 54 is brought into its ON state and the P-channel transistor 55 is brought into its OFF state regardless of the level of a data applied to the buffer circuitry, as shown in FIGS. 20 and 21. In this case, the power supply line is thus connected to the first power supply 42 rather than the second power supply 43, and therefore the driving capability of the buffer circuitry is not improved when the incoming data is at a HIGH level. In contrast, when the incoming data is at a LOW level, the driving capability of the buffer circuitry is not affected at all because the power supply line is not connected to the output terminal 19.

As previously mentioned, in accordance with the third embodiment of the present invention, the buffer circuitry can connect the first power supply 42 to the power supply line when the frequency of CLK is less than or equal to the reference frequency, whereas it can connect the second power supply 43 having a higher potential than the first power supply 42 to the power supply line when the frequency of CLK is greater than the reference frequency. As a result, the buffer circuitry can change the strobe point without having to change the test program. The third embodiment of the present invention thus offers the advantage of being able to check the condition of the buffer circuitry at once even if the frequency of CLK is varied.

Figure 25:
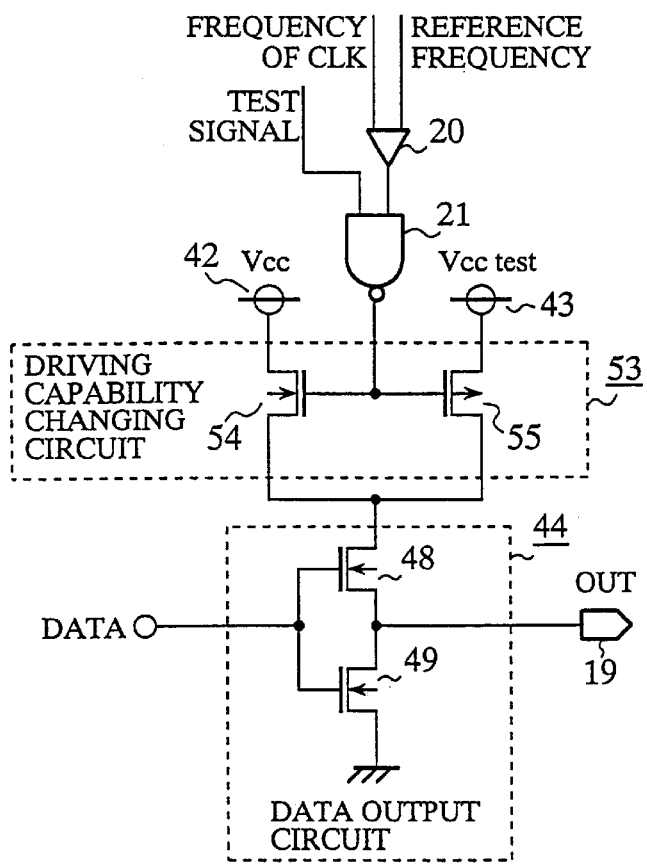
FIG. 25 is a schematic circuit diagram showing the structure of buffer circuitry according to a variant of the third embodiment of the present invention.
Figure 26:
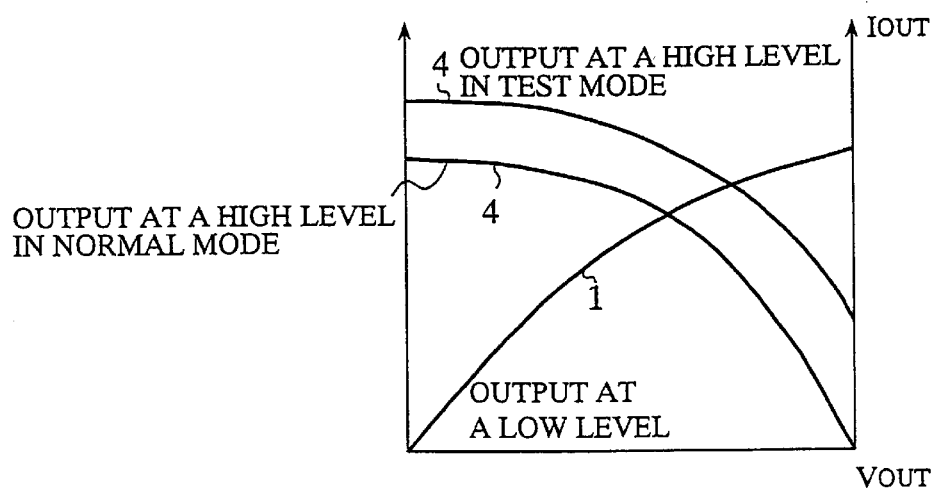
FIG. 26 is a diagram showing the waveforms of data furnish by way of the output terminal of the buffer circuitry of the variant of FIG. 25, for explaining the driving capability of the buffer circuitry.

Referring next to FIG. 25, there is illustrated a schematic circuit diagram of a variant of the third embodiment of the present invention. In the variant, the data output circuit 44 is constructed of only two N-channel transistors 48, instead of being constructed of a plurality of N-channel transistors and a plurality of P-channel transistors. This variant can offer the same advantage as provided by the third embodiment mentioned above. The amount of output current flowing in test mode is increased as compared with that in normal mode with an increase in the potential of the power supply applied to the data output circuit, as shown in FIG. 26.

Fourth Embodiment

Figure 27:
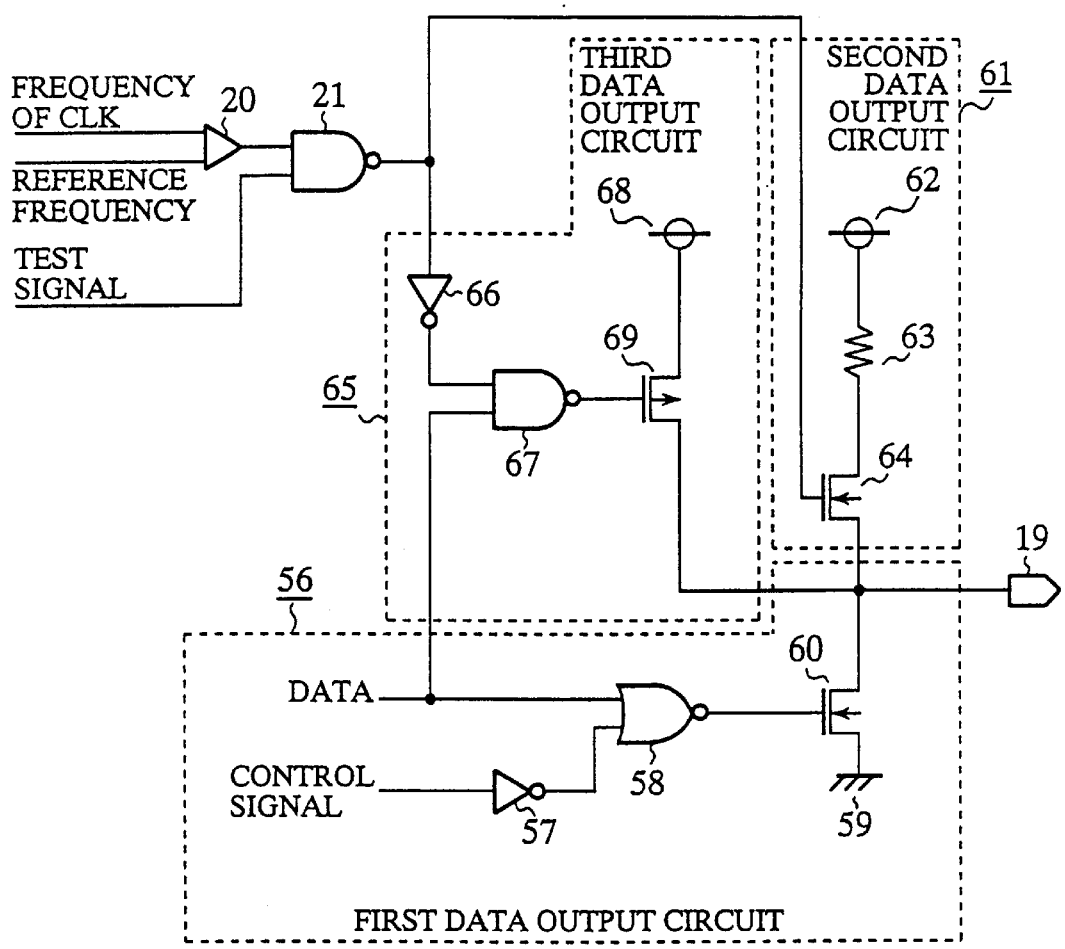
FIG. 27 is a schematic circuit diagram showing the structure of buffer circuitry according to a fourth embodiment of the present invention.

Referring next to FIG. 27, there is illustrated a schematic circuit diagram showing the structure of buffer circuitry according to a fourth embodiment of the present invention. In the figure, the same reference numerals as shown in FIG. 1 designate the same elements as those of the above-mentioned first embodiment of the present invention or like elements, and therefore the description of those elements will be omitted hereinafter.

In FIG. 27, reference numeral 56 denotes a first data output circuit for connecting a ground 59 to an output terminal 19 when the buffer circuit receives a data at a LOW level, 57 denotes an inverter for inverting a control signal applied thereto, 58 denotes a NOR gate for implementing the logical NOR operation on an output signal from the inverter 57 and the data applied thereto, and 60 denotes an N-channel transistor that is turned on when the NOR gate 58 furnishes an output signal at a HIGH level, and that is turned off when the NOR gate 58 furnishes an output signal at a LOW level.

In addition, reference numeral 61 denotes a second data output circuit for connecting a first power supply 62, by way of a pull-up resistor 63, to the output terminal 19 when the frequency of CLK is less than or equal to a reference frequency, and 64 denotes an N-channel transistor that is turned on when an NAND gate 21 furnishes an output signal at a HIGH level, and that is turned off when the NAND gate 21 furnishes an output signal at a LOW level.

Furthermore, reference numeral 65 denotes a third data output circuit for connecting a second power supply 68 having the same potential as the first power supply 62 to the output terminal 19 when the buffer circuitry receives a data at a HIGH level and when the frequency of CLK is greater than the reference frequency, 66 denotes an inverter for inverting the output signal of the NAND gate 21, 67 denotes a NAND gate for implementing the logical NAND operation on an output signal from the inverter 66 and the data applied thereto, and 69 denotes a P-channel transistor that is turned off when the NAND gate 67 furnishes an output signal at a HIGH level, and that is turned on when the NAND gate 67 furnishes an output signal at a LOW level.

Figure 29:
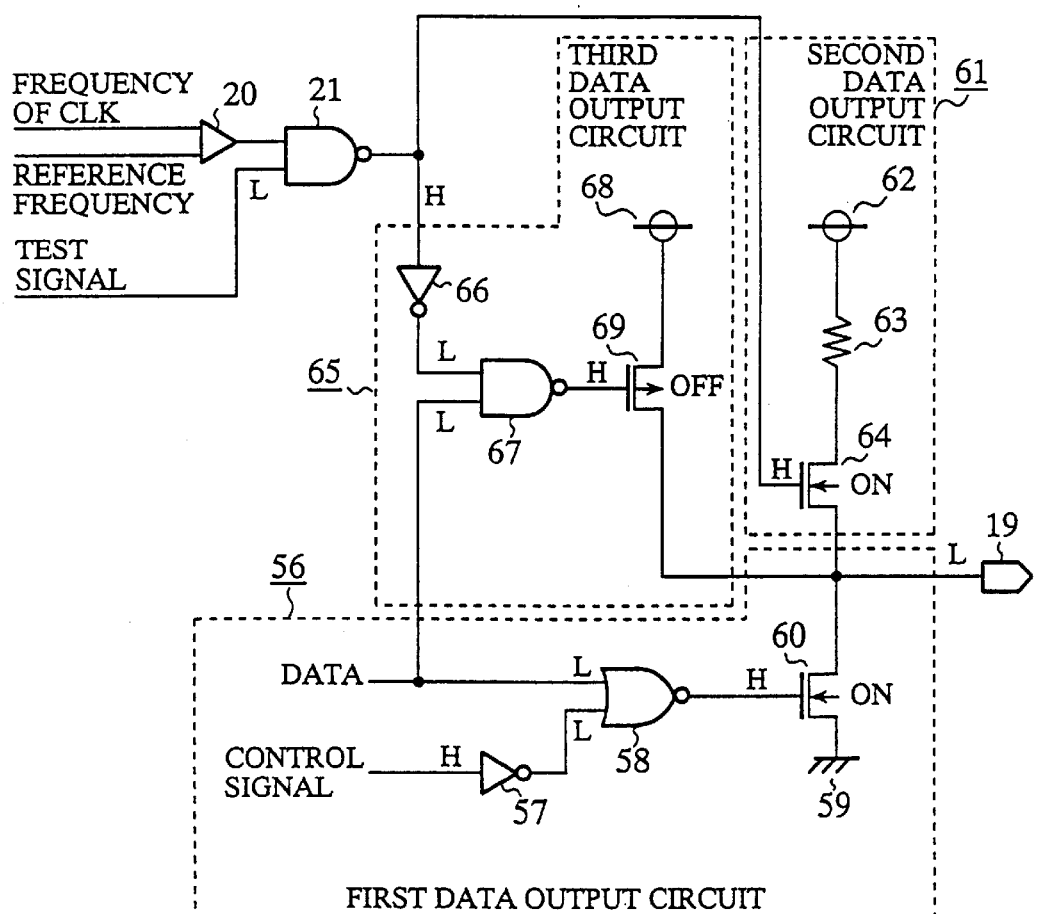
FIG. 29 is a schematic circuit diagram showing an operation of the buffer circuitry of the fourth embodiment that is placed in normal mode when the buffer circuitry receives a data at a LOW level.

When the first data output circuit 56 of the buffer circuitry receives a data at a LOW level, the N-channel transistor 60 is brought into its ON state and hence the ground 59 is connected to the output terminal 19, as shown in FIG. 29. Consequently, the buffer circuitry furnishes an output signal at a LOW level regardless of the comparison result of a comparator 20.

Figure 28:
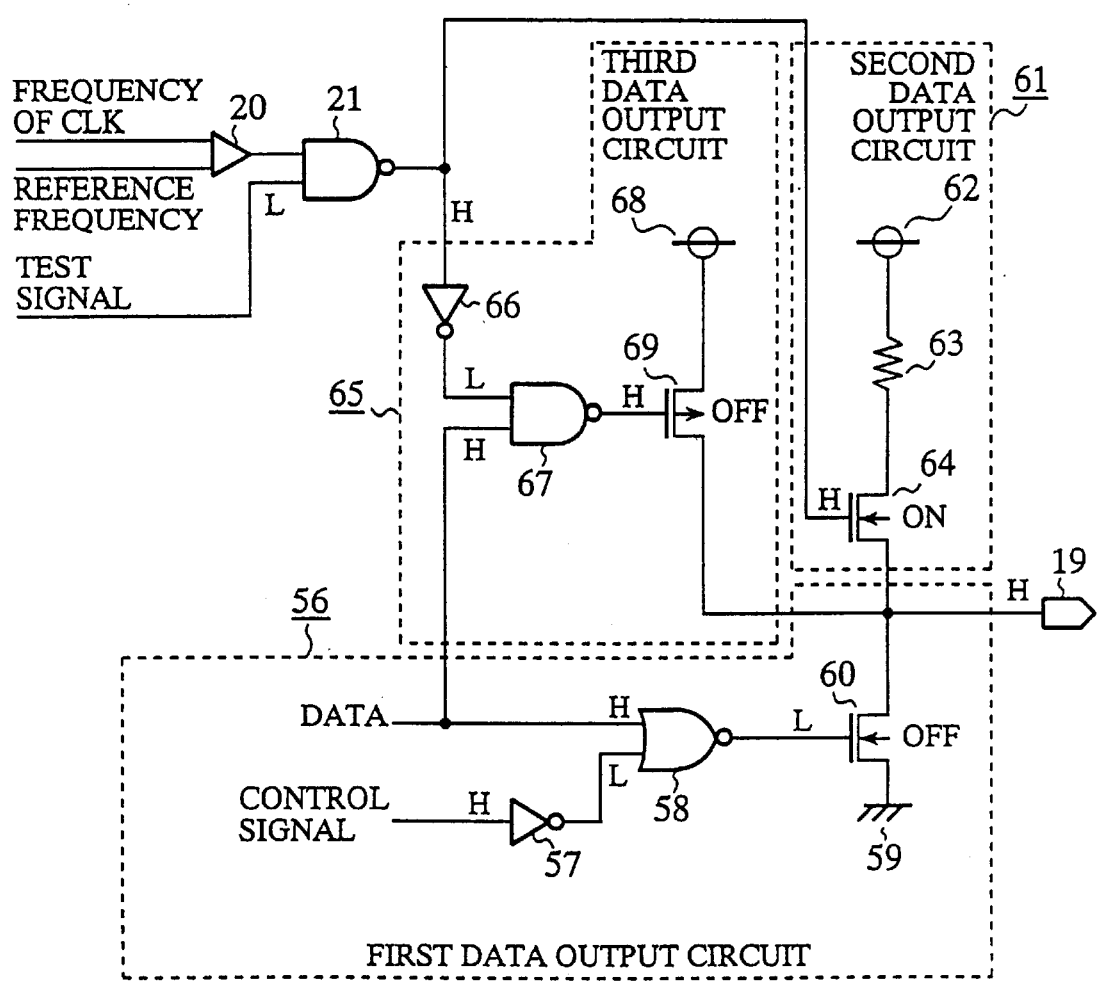
FIG. 28 is a schematic circuit diagram showing an operation of the buffer circuitry of the fourth embodiment that is placed in normal mode when the buffer circuitry receives a data at a HIGH level.

In contrast, when the first data output circuit 56 of the buffer circuitry receives a data at a HIGH level, the N-channel transistor 60 is brought into its OFF state and hence the first data output circuit 56 is separated from the buffer circuitry, as shown in FIG. 28. In this case, if the buffer circuitry is placed in normal mode in which the checking of the condition of the buffer circuitry is not carried out, the output of the NAND gate 21 goes HIGH and then remains at a HIGH level regardless of the comparison result of the comparator 20 because the NAND gate 21 receives a test signal at a LOW level. As a result, the N-channel transistor 64 of the second data output circuit 61 is brought into its ON state and the first power supply 62 is thus connected to the output terminal 19 by way of the pull-up resistor 63. Accordingly, when the buffer circuitry receives a data at a HIGH level, it can furnish an output signal at a HIGH level, as shown in FIG. 28 (in this case, the first data output circuit 56 is separated from the buffer circuitry, as mentioned above).

In normal mode in which the checking of the condition of the buffer circuitry is not carried out, the P-channel transistor 69 of the third data output circuit 65 is brought into its OFF state, as shown in FIG. 28. Therefore, while the second power supply 68 of the third data output circuit 65 is not connected to the output terminal 19, the first power supply 62 of the second data output circuit 61 is connected to the output terminal 19. In this case, since the first power supply 62 is connected to the output terminal 19 by way of the pull-up resistor 63, the amount of output current is decreased as compared with the case that only the second power supply 68 is connected to the output terminal 19 (in test mode), and hence the driving capability of the buffer circuitry is relatively low.

In contrast, in test mode in which the checking of the condition of the buffer circuitry is carried out, the test signal applied to the NAND gate 21 goes HIGH and is held at a HIGH level. For example, when the frequency of CLK is greater than the reference frequency (e.g. 45 MHz), the comparator 20 furnishes an output signal at a HIGH level. In this case, when the buffer circuitry receives a data at a HIGH level, the P-channel transistor 69 of the third data circuit is brought into its ON state and the N-channel transistor 64 of the second data output circuit 61 is brought into its OFF state, as shown in FIG. 32. As a result, while the first power supply 62 of the second data output circuit 61 is not connected to the output terminal 19, the second power supply 68 of the third data output circuit 65 is connected to the output terminal 19. In this case, since the second power supply 68 is directly connected, not by way of the pull-up resistor 63, to the output terminal 19, the amount of output current is decreased as compared with the case that only the first power supply 62 is connected, by way of the pull-up resistor 63, to the output terminal 19 (in normal mode), and hence the driving capability of the buffer circuitry is increased.

In the case that the frequency of CLK is greater than the reference frequency (e.g. 45 MHz), both the P-channel transistor 69 of the third data output circuit and the N-channel transistor 64 of the second data output circuit are brought into their ON state when the buffer circuitry receives a data at a LOW level, as shown in FIG. 33. In this case, the output terminal 19 is connected to the ground 59. As a result, the buffer circuitry furnishes an output signal at a LOW level by way of the output terminal 19 with its driving capability being improved.

Figure 30:
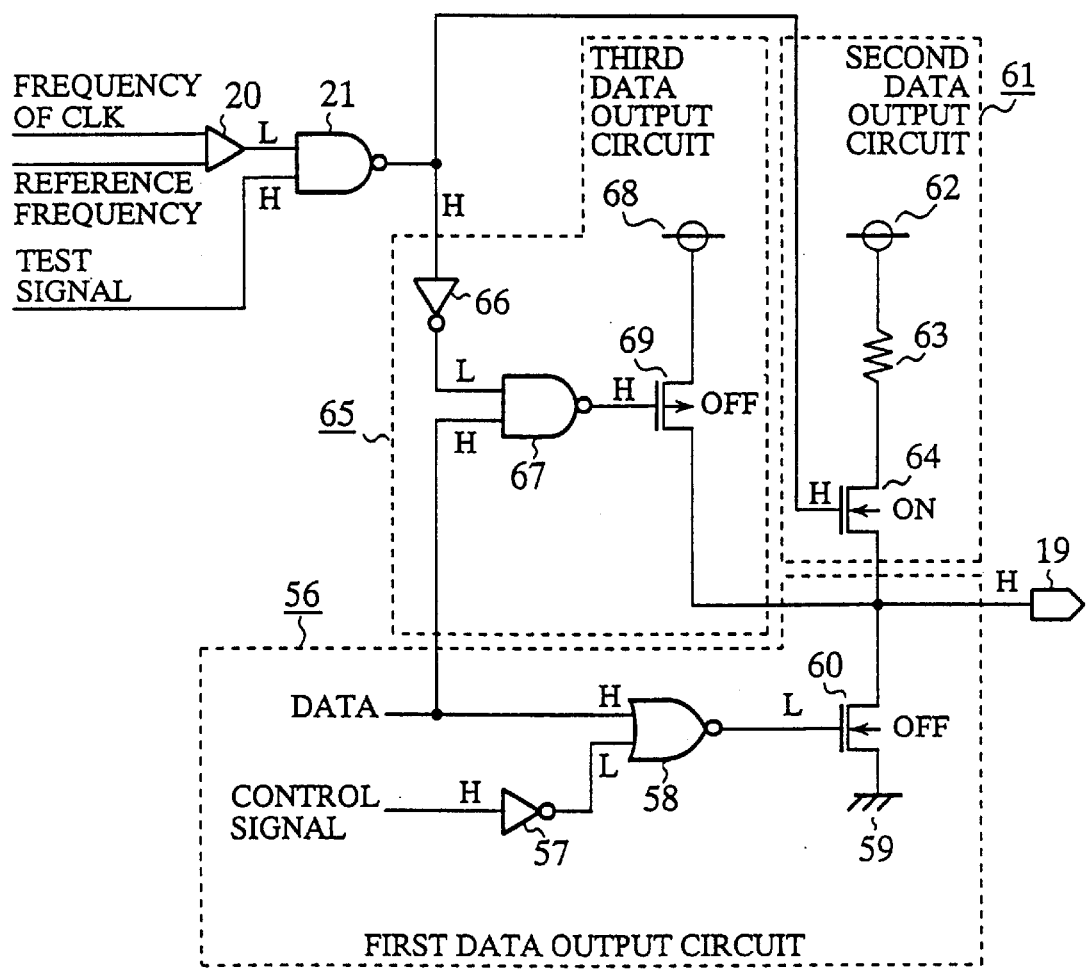
FIG. 30 is a schematic circuit diagram showing an operation of the buffer circuitry of the fourth embodiment that is placed in test mode when the buffer circuitry receives a data at a HIGH level and when the frequency of the clock signal is less than or equal to the reference frequency.
Figure 31:
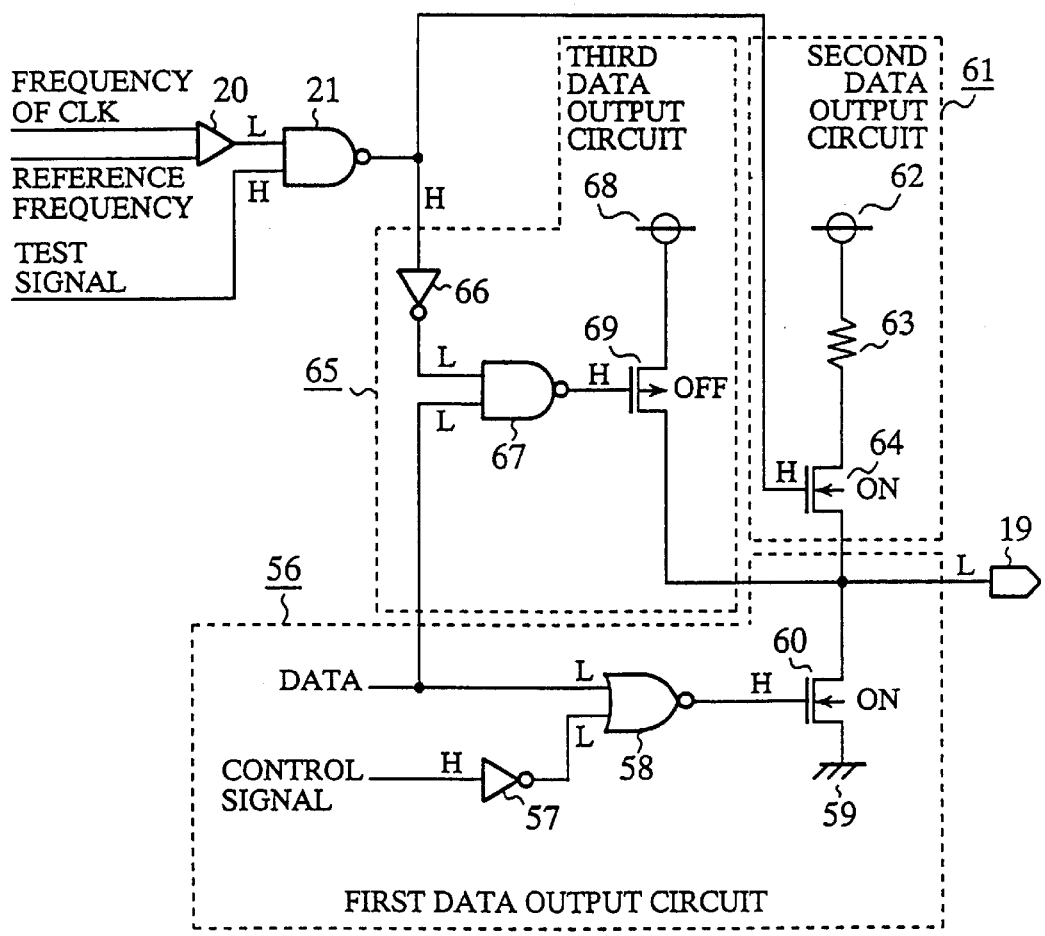
FIG. 31 is a schematic circuit diagram showing an operation of the buffer circuitry of the fourth embodiment that is placed in test mode when the buffer circuitry receives a data at a LOW level and when the frequency of the clock signal is less than or equal to the reference frequency.

As previously explained, when the frequency of CLK is greater than the reference frequency, the NAND circuit 21 activates the third data output circuit 65 only if the buffer circuitry is placed in test mode to check for operation of the buffer circuitry. However, even in test mode, since the comparator 20 furnishes a signal at a LOW level and hence the NAND gate 21 furnishes an output signal at a HIGH level when the frequency of CLK is less than or equal to the reference frequency (e.g. 45 MHz), the P-channel transistor 69 of the third data output circuit is brought into its OFF state and the N-channel transistor 64 of the second data output circuit 61 is brought into their ON state regardless of the level of a data applied to the buffer circuitry, as shown in FIGS. 30 and 31. Thus, even if the buffer circuitry is placed in test mode, when the frequency of CLK is less than or equal to the reference frequency, the third data output circuit 65 is deactivated and therefore the driving capability of the buffer circuitry in test mode is not affected at all, as in normal mode.

As previously mentioned, in accordance with the fourth embodiment of the present invention, the buffer circuitry can connect the first power supply 62, by way of the pull-up resistor 63, to the output terminal 19 when the frequency of CLK is less than or equal to the reference frequency, whereas it can directly connect the second power supply 68 to the output terminal 19 if the buffer circuitry receives an incoming data at a HIGH level when the frequency of CLK is greater than the reference frequency. As a result, the buffer circuitry can change the strobe point without having to change the test program. The fourth embodiment of the present invention thus offers the advantage of being able to check the condition of the buffer circuitry at once even if the frequency of CLK is varied.

In a variant of the fourth embodiment shown, the second power supply 68 of the third data output circuit 65 can have a higher potential than the power supply 62 of the second data output circuit 61 (for example, the power supply 68 has a potential of 5V and the power supply 62 has a potential of 4V). In the variant, the pull-up resistor 63 connected between the first power supply 62 and the N-channel transistor 64 can be eliminated.

Many widely different embodiments of the present invention may be constructed without departing from the spirit and scope of the present invention. It should be understood that the present invention is not limited to the specific embodiments described in the specification, except as defined in the appended claims.

What is claimed is:

1. Buffer circuitry for receiving a data applied thereto and furnishing a signal corresponding to said data by way of an output terminal, said buffer circuitry comprising:

first data output means for connecting a ground to said output terminal when said data is at a LOW level;

comparison means for comparing the frequency of a clock signal applied thereto with a reference frequency;

second data output means for connecting a first potential to said output terminal when said comparison means outputs a comparison result indicating that the frequency of said clock signal is less than or equal to said reference frequency; and third data output means for connecting a second potential that is higher than said first potential to said output terminal when said comparison means outputs a comparison result indicating that the frequency of said clock signal is greater than said reference frequency and when said data is at a HIGH level.

2. The buffer circuitry according to claim 1, wherein said second data output means includes a first power supply and connects said first power supply to said output terminal when connecting said first potential to said output terminal, and said third data output means includes a second power supply having a higher potential than said first power supply and connects said second power supply to said output terminal when connecting said second potential to said output terminal.

3. The buffer circuitry according to claim 2, further comprising means for causing said second data output means to connect said first power supply to said output terminal and for deactivating said third data output means, regardless of a comparison result from said comparison means, if said buffer circuitry is not placed in test mode to check for operation of said buffer circuitry.

4. The buffer circuitry according to claim 1, wherein said second data output means includes a first power supply and a pull-up resistor and connects said first power supply, by way of said pull-up resistor, to said output terminal when connecting said first potential to said output terminal, and said third data output means includes a second power supply having the same potential as said first power supply and connects said second power supply to said output terminal when connecting said second potential to said output terminal.

5. The buffer circuitry according to claim 4, further comprising means for causing said second data output means to connect said first power supply to said output terminal and for deactivating said third data output means, regardless of a comparison result from said comparison means, if said buffer circuitry is not placed in test mode to check for operation of said buffer circuitry.

\* \* \* \* \*

UNITED STATES PATENT AND TRADEMARK OFFICE
CERTIFICATE OF CORRECTION

PATENT NO.    : 6,313,669 B1
DATED         : November 6, 2001
INVENTOR(S)   : Koichi Suenaga It is certified that error appears in the above-identified patent and that said Letters Patent is hereby corrected as shown below:

<u>Title page,</u>
The following additional Assignee is added:
-- [73] Mitsubishi Electric System LSI Design Corporation, Hyogo (JP) --

Signed and Sealed this

Seventh Day of May, 2002

*Attest:*

*Attesting Officer*

JAMES E. ROGAN
*Director of the United States Patent and Trademark Office*